(12) United States Patent
Yamazaki et al.

(10) Patent No.: US 7,486,344 B2
(45) Date of Patent: Feb. 3, 2009

(54) SEMICONDUCTOR DISPLAY DEVICE AND MANUFACTURING METHOD THEREOF

(75) Inventors: Shunpei Yamazaki, Tokyo (JP); Jun Koyama, Kanagawa (JP); Hideomi Suzawa, Kanagawa (JP); Koji Ono, Kanagawa (JP); Tatsuya Arao, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/679,936

(22) Filed: Feb. 28, 2007

(65) Prior Publication Data

US 2007/0138480 A1   Jun. 21, 2007

Related U.S. Application Data

(63) Continuation of application No. 09/809,646, filed on Mar. 16, 2001, now Pat. No. 7,218,361.

(30) Foreign Application Priority Data

Mar. 27, 2000   (JP) .............................. 2000-086720

(51) Int. Cl.
   *G02F 1/136* (2006.01)
(52) U.S. Cl. .............................. 349/43; 349/46; 349/47; 349/110; 349/138
(58) Field of Classification Search .................... 349/43, 349/38, 39, 46, 47, 138, 139, 143, 147, 110
   See application file for complete search history.

(56) References Cited

U.S. PATENT DOCUMENTS

| | | |
|---|---|---|
| 4,394,182 A | 7/1983 | Maddox, III |
| 5,079,606 A | 1/1992 | Yamamura |
| 5,177,571 A | 1/1993 | Satoh |
| 5,182,620 A | 1/1993 | Shimada |
| 5,272,100 A | 12/1993 | Satoh |
| 5,585,951 A | 12/1996 | Noda |
| 5,605,847 A | 2/1997 | Zhang |
| 5,637,894 A | 6/1997 | Hori |
| 5,643,801 A | 7/1997 | Ishihara |
| 5,643,826 A | 7/1997 | Ohtani |
| 5,717,224 A | 2/1998 | Zhang |
| 5,731,216 A | 3/1998 | Holmberg |
| 5,750,430 A | 5/1998 | Son |
| 5,767,530 A | 6/1998 | Ha |

(Continued)

FOREIGN PATENT DOCUMENTS

CN   1241025 A   1/2000

(Continued)

OTHER PUBLICATIONS

Australian Search Report dated Sep. 24, 2004 issued in Singapore Application No. SG 200101320-0, (5 pages).

(Continued)

*Primary Examiner*—Thoi V Duong
(74) *Attorney, Agent, or Firm*—Fish & Richardson P.C.

(57) ABSTRACT

A highly reliable semiconductor display device is provided. The semiconductor display device has a channel forming region, an LDD region, and a source region and a drain region in a semiconductor layer, and the LDD region overlaps with a first gate electrode, sandwiching a gate insulating film.

12 Claims, 22 Drawing Sheets

U.S. PATENT DOCUMENTS

| | | | |
|---|---|---|---|
| 5,767,531 A | 6/1998 | Yoshinouchi |
| 5,818,552 A | 10/1998 | Sato |
| 5,828,103 A | 10/1998 | Hsu |
| 5,835,172 A | 11/1998 | Yeo |
| 5,853,960 A | 12/1998 | Tran |
| 5,886,364 A | 3/1999 | Zhang |
| 5,889,302 A | 3/1999 | Liu |
| 5,891,764 A | 4/1999 | Ishihara |
| 5,923,962 A | 7/1999 | Ohtani |
| 5,966,193 A | 10/1999 | Zhang |
| 5,982,471 A | 11/1999 | Hirakata |
| 5,986,305 A | 11/1999 | Wu |
| 5,990,491 A | 11/1999 | Zhang |
| 6,013,928 A | 1/2000 | Yamazaki |
| 6,031,290 A | 2/2000 | Miyazaki |
| 6,067,131 A | 5/2000 | Sato |
| 6,088,070 A | 7/2000 | Ohtani |
| 6,100,954 A | 8/2000 | Kim |
| 6,166,414 A | 12/2000 | Miyazaki |
| 6,198,133 B1 | 3/2001 | Yamazaki |
| 6,225,150 B1 | 5/2001 | Lee |
| 6,243,155 B1 | 6/2001 | Zhang |
| 6,252,248 B1 | 6/2001 | Sano |
| 6,259,138 B1 | 7/2001 | Ohtani |
| 6,259,200 B1 | 7/2001 | Morita |
| 6,294,815 B1 | 9/2001 | Yamazaki |
| 6,326,249 B1 | 12/2001 | Yamazaki |
| 6,327,006 B1 | 12/2001 | Sato |
| 6,331,473 B1 | 12/2001 | Hirabayashi |
| 6,335,290 B1 | 1/2002 | Ishida |
| 6,335,540 B1 | 1/2002 | Zhang |
| 6,340,830 B1 | 1/2002 | Takemura |
| 6,365,917 B1 | 4/2002 | Yamazaki |
| 6,369,410 B1 | 4/2002 | Yamazaki |
| 6,380,561 B1 | 4/2002 | Ohtani |
| 6,392,255 B1 | 5/2002 | Shibata |
| 6,396,105 B1 | 5/2002 | Yamazaki |
| 6,403,406 B2 | 6/2002 | Lee |
| 6,452,241 B1 * | 9/2002 | Fukata et al. ............... 257/435 |
| 6,462,802 B1 | 10/2002 | Nishimura |
| 6,462,806 B2 | 10/2002 | Zhang |
| 6,501,097 B1 | 12/2002 | Zhang |
| 6,555,420 B1 | 4/2003 | Yamazaki |
| 6,567,136 B1 | 5/2003 | Sakuramoto |
| 6,573,589 B2 | 6/2003 | Zhang |
| 6,576,926 B1 | 6/2003 | Yamazaki |
| 6,583,472 B1 | 6/2003 | Shibata |
| 6,624,012 B2 | 9/2003 | Shibata |
| 6,630,722 B1 | 10/2003 | Aoki |
| 6,638,800 B1 | 10/2003 | Ishihara |
| 6,642,544 B1 | 11/2003 | Hamada |
| 6,740,938 B2 | 5/2004 | Tsunoda |
| 6,759,678 B2 | 7/2004 | Yamazaki |
| 6,949,767 B2 | 9/2005 | Yamazaki |
| 6,998,299 B2 | 2/2006 | Shibata |
| 7,038,294 B2 | 5/2006 | Ma |
| 2001/0008781 A1 | 7/2001 | Lee |
| 2002/0000551 A1 | 1/2002 | Yamazaki |
| 2002/0005905 A1 | 1/2002 | Yamazaki |
| 2002/0063261 A1 | 5/2002 | Zhang |
| 2002/0132399 A1 | 9/2002 | Shibata |
| 2002/0134983 A1 | 9/2002 | Yamazaki |
| 2002/0142512 A1 | 10/2002 | Ma |
| 2003/0116766 A1 | 6/2003 | Zhang |
| 2004/0058483 A1 | 3/2004 | Shibata |
| 2004/0126945 A1 | 7/2004 | Shibata |
| 2004/0206974 A1 | 10/2004 | Yamazaki |
| 2005/0167674 A1 | 8/2005 | Shibata |

FOREIGN PATENT DOCUMENTS

| | | |
|---|---|---|
| CN | 1258103 | 6/2000 |
| EP | 0 450 941 | 10/1991 |
| EP | 0 762 180 | 3/1997 |
| EP | 0 997 769 | 5/2000 |
| EP | 1 001 467 | 5/2000 |
| EP | 1 003 223 | 5/2000 |
| EP | 1 005 093 | 5/2000 |
| EP | 1 031 873 | 8/2000 |
| EP | 1 041 641 | 10/2000 |
| EP | 1 081 676 | 3/2001 |
| EP | 1 087 438 | 3/2001 |
| JP | 59-121876 | 7/1984 |
| JP | 05-243262 | 9/1993 |
| JP | 06-148685 | 5/1994 |
| JP | 07-130652 | 5/1995 |
| JP | 07-235680 | 9/1995 |
| JP | 08-78329 | 3/1996 |
| JP | 08-274336 | 10/1996 |
| JP | 09-043639 | 2/1997 |
| JP | 10-031235 | 2/1998 |
| JP | 10-093103 | 4/1998 |
| JP | 10-135468 | 5/1998 |
| JP | 10-135469 | 5/1998 |
| JP | 10-189999 | 7/1998 |
| JP | 10-233511 | 9/1998 |
| JP | 11-087726 | 3/1999 |
| JP | 11-261075 | 9/1999 |
| JP | 11-274502 | 10/1999 |
| JP | 2000-010120 | 1/2000 |
| JP | 2000-131716 | 5/2000 |
| JP | 2001-210832 | 8/2001 |

OTHER PUBLICATIONS

M. Baldo et al., "Very High-Efficiency Green Organic Light-Emitting Devices Based on Electrophosphorescence", Applied Physics Letters, vol. 75, No. 1, Jul. 5, 1999; pp. 4-6.

M. Baldo et al., "Highly Efficient Phosphorescent Emission from Organic Electroluminescent Devices", Nature, vol. 395, Sep. 10, 1998, pp. 151-154.

Hatano et al.; "A Novel Self-aligned Gate-overlapped LDD Poly-Si TFT with High Reliability and Performance"; IEDM Technical Digest 97; pp. 523-526; 1997.

Hirai, "A high-Aperture-Ratio a-Si TFT Liquid Crystal Light Valve for Workstations," Apr. 1994, pp. 165-170, 298 NEC Research & Development 35, No. 2, Tokyo, Japan.

Kumar, "Kink-Free Polycrystalline Silicon Double-Gate Elevated-Channel Thin-Film Transistors," Dec. 1998, pp. 2514-2520, IEEE transactions on Electron Devices; vol. 45, No. 12.

T. Tsutsui et al., "High Quantum Efficiency in Organic Light-Emitting Devices with Iridium-Complex as a Triple Emissive Center", JPN. J. Appl. Physics, vol. 38, Part 2, No. 12B, Dec. 15, 1999, pp. L1502-L1504.

T. Tsutsui et al., "Electroluminescence in Organic Thin Films", Photochemical Processes in Organized Molecular Systems, Jan. 1, 1991, pp. 437-450.

Yoo, "Pixel Design for TFT-LCD with Double Gate Poly-Si TFT and Double Layer Storage Capacitor," *Proceedings of the Fourth Asian Symposium on Information Display*, 1997, pp. 219-222, School of Electrical Engineering, Seoul National University, Seoul, Korea, Samsung Electronics Co., Ltd. Korea.

* cited by examiner

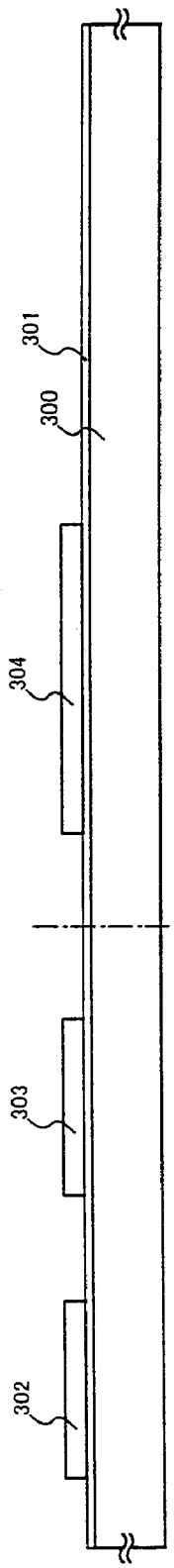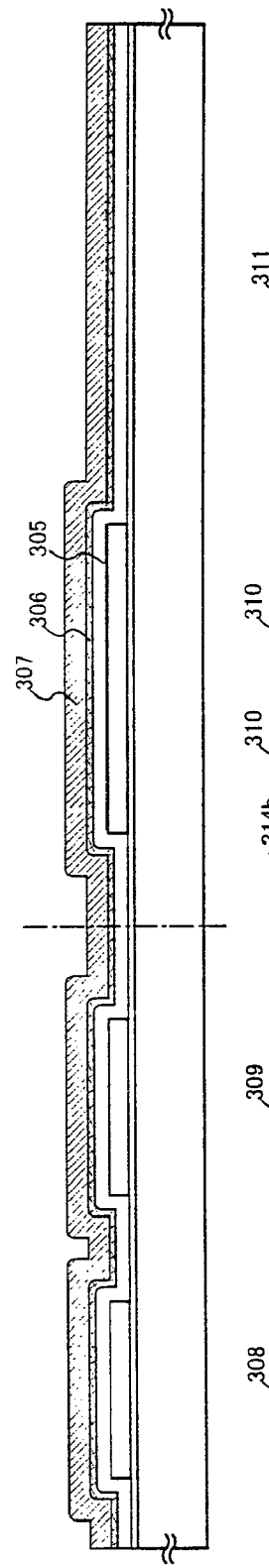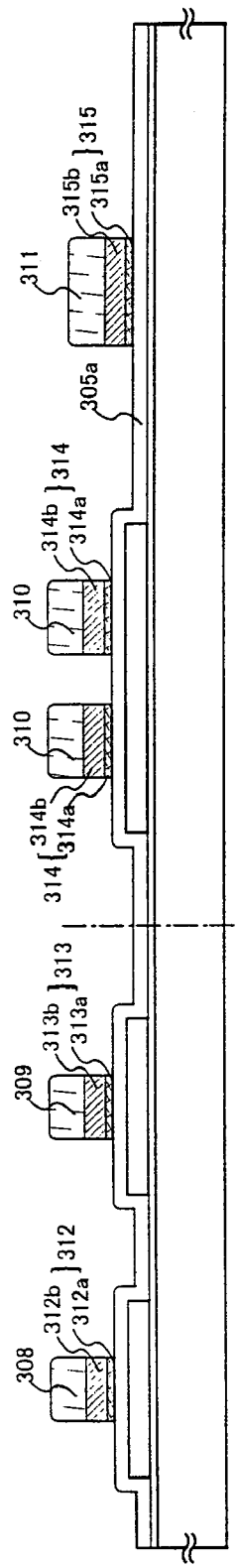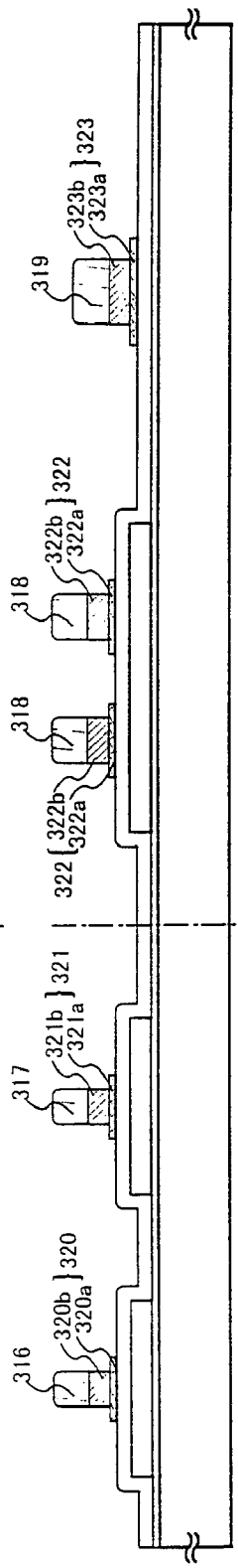

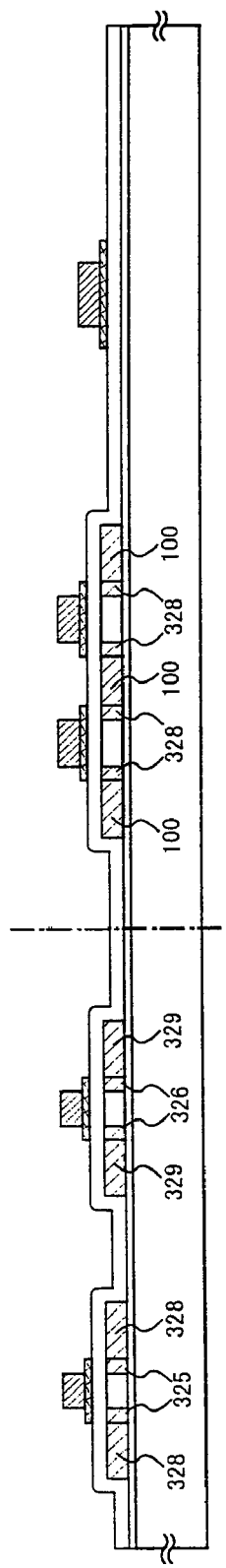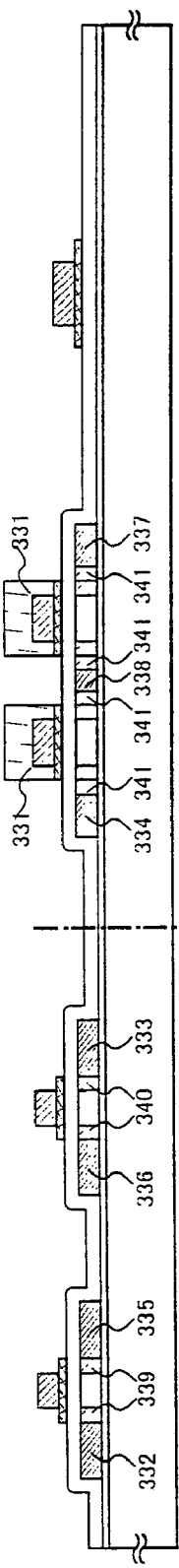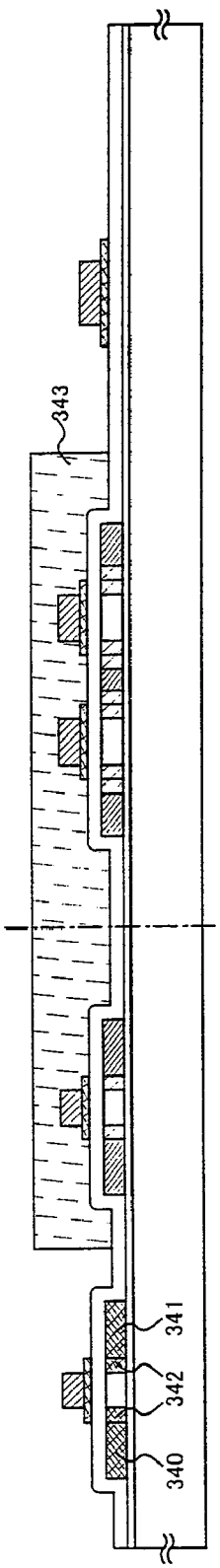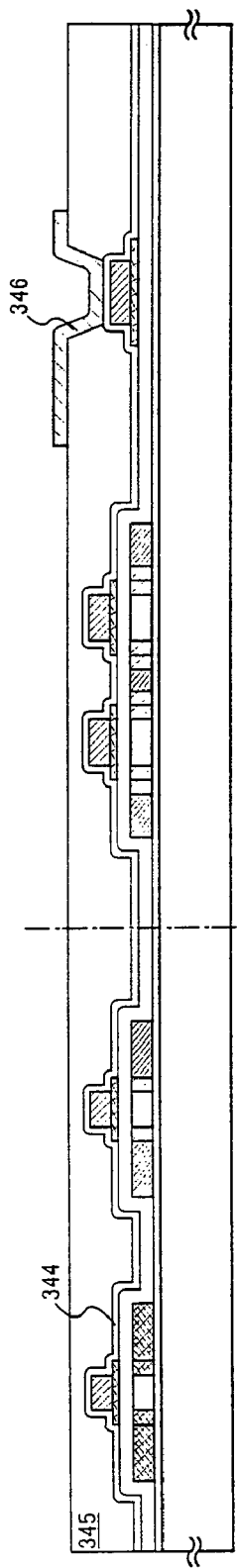
Fig. 4A
Fig. 4B
Fig. 4C
Fig. 4D

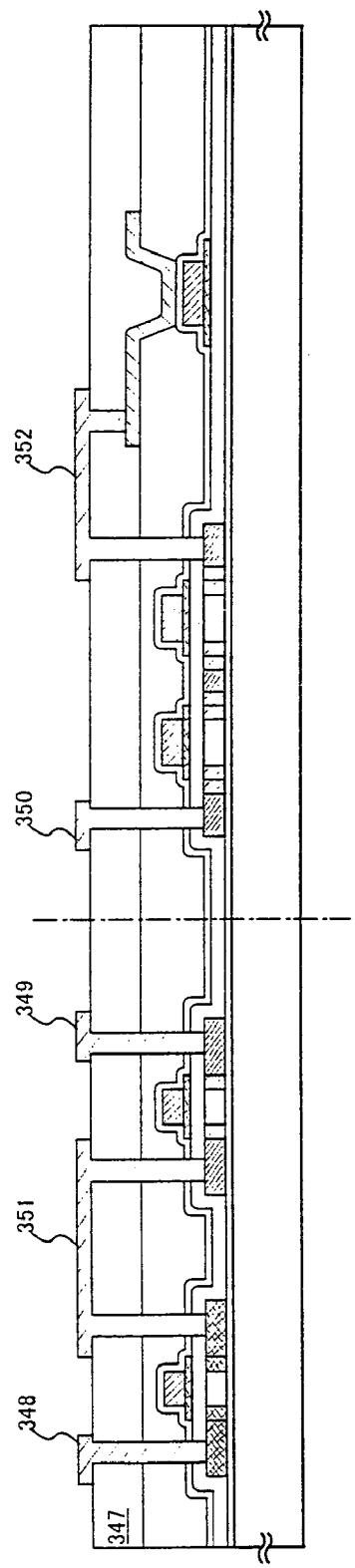
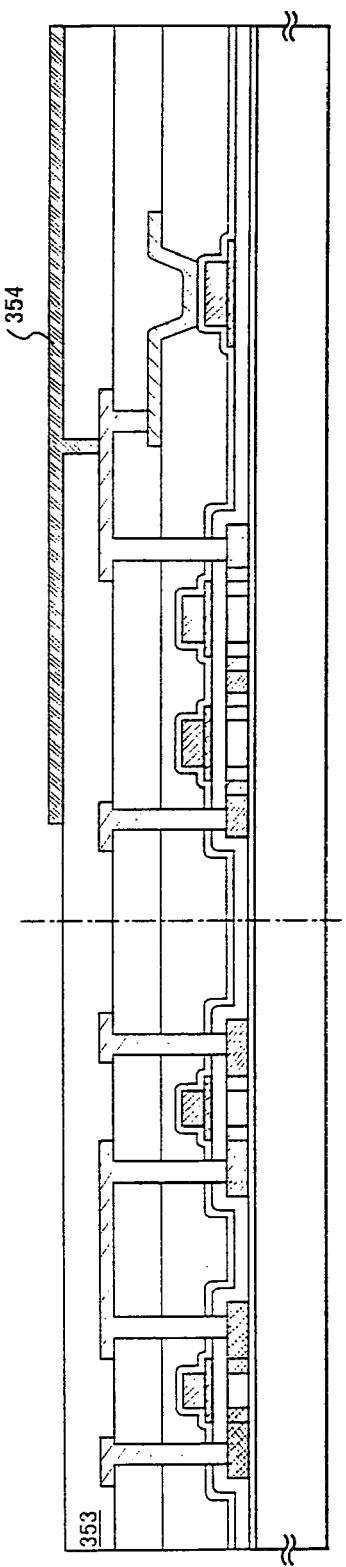
Fig. 5A
Fig. 5B

SEMICONDUCTOR DISPLAY DEVICE AND MANUFACTURING METHOD THEREOF

BACKGROUND OF THE INVENTION

1. Field of the Invention

The present invention relates to a semiconductor display device using a semiconductor element (an element using a semiconductor thin film), and in particular to a liquid crystal display device. Further, the present invention relates to electronic equipment using the semiconductor display device in a display portion.

2. Description of the Related Art

Techniques of using a semiconductor thin film (on the order of several nm to several hundred of nm thick) formed on a substrate having an insulating surface in order to form a thin film transistor (TFT) have been in the spotlight in recent years. Thin film transistors are widely applied to electronic devices such as ICs and semiconductor display devices, and in particular, are rapidly being developed as switching elements for liquid crystal display devices.

An active matrix liquid crystal display device has a pixel portion composed of a plurality of pixels, each of which has a TFT (pixel TFT) and liquid crystal cell. The liquid crystal cells have a pixel electrode, an opposing electrode, and a liquid crystal formed between the pixel electrode and the opposing electrode. An image is displayed in the pixel portion by controlling the voltage applied to the pixel electrodes by the pixel TFTs.

In particular, a high mobility can be obtained from a TFT using a semiconductor film having a crystalline structure as an active layer (crystalline TFT), and it is therefore possible to integrate functionality circuits on the same substrate and realize a liquid crystal display device that performs a high definition image display.

Semiconductor films having a crystalline structure include single crystal semiconductors, polycrystalline semiconductors, and microcrystalline semiconductors in this specification, and in addition, include the semiconductors disclosed in Japanese Patent Application Laid-open No. Hei 7-130652, Japanese Patent Application Laid-open No. Hei 8-78329, Japanese Patent Application Laid-open No. Hei 10-135468, and 10-135469.

Between one million and two million crystalline TFTs are necessary in only the pixel portion in order to structure the active matrix liquid crystal display device, and more than that number of crystalline TFTs are required for the attached functionality circuits formed in the periphery. The specifications required for the liquid crystal display device are strict, and in order to perform stable image display, it is necessary to assure the reliability of each crystalline TFT.

TFT characteristics can be considered as divided between those of an on state and those of an off state. Characteristics such as on current, mobility, S-value, and threshold value can be known from on state characteristics, and off current is the most important off state characteristic.

However, there is a problem in that the off current easily becomes high with crystalline TFTs.

Furthermore, crystalline TFTs are still not used in MOS transistors (transistors manufactured on a crystalline semiconductor substrate) used in LSIs from a reliability standpoint. For example. a degradation phenomenon in which the mobility and the on current (the electric current flowing when the TFT is in an on state) drop, and the off current (the electric current flowing when the TFT is in an off state) rises, when a crystalline TFT is continuously driven has been observed. It is thought that the hot carrier effect is the cause, and that the degradation phenomenon is caused by hot carriers developing due to a high electric field in the vicinity of a drain.

A lightly doped drain (LDD) structure is known as a method of lowering the off current and relieving the high electric field in the vicinity of the drain in a MOS transistor. A low concentration impurity region is formed on the outside of a channel region with this structure, and the low concentration impurity region is referred to as an LDD region.

In particular, the high electric field in the vicinity of the drain is relieved, the hot carrier effect can be prevented, and the reliability can be increased when there is a structure in which the LDD region overlaps with a gate electrode through a gate insulating film (GOLD (gate-drain overlapped LDD) structure). Note that a region in which the LDD region overlaps with the gate electrode through the gate insulating film is referred to as an Lov region (first LDD region) in this specification.

Note also that structures such as an LATID (large tilt angle implanted drain) structure and an ITLDD (inverse T LDD) structure are known as GOLD structures. There is a GOLD structure in which sidewalls are formed by silicon, for example, reported in Hatano, M., Akimoto, H., and Sakai, T., IEDM97 Technical Digest, positive. 523-6, 1997, and it has been confirmed that an extremely superior reliability can be obtained compared with other TFT structures.

Note that, in this specification, a region in which the LDD region does not overlap with the gate electrode through the gate insulating film is referred to as an Loff region (second LDD region).

Several methods of manufacturing a TFT possessing both an Loff region and an Lov region have been proposed. A method of only using a mask without self alignment, and a method of using a gate electrode having two layers with mutually differing widths and a gate insulating film with self alignment, can be given as methods of forming the Lov region and the Loff region.

However, two masks are required in order to form the Lov region and the Loff region when using a mask, and the number of process steps is increased. On the other hand, when forming the Lov region and the Loff region with self alignment, the number of masks need not be increased, and it is possible to suppress the number of process steps. However, the width of the gate electrode and the thickness of the gate insulating film influence the position in which the Lov region and the Loff region are formed. The etching rates of the gate electrode and the gate insulating film often differ largely, and it is difficult to precisely control the positional alignment of the Lov region and the Loff region.

SUMMARY OF THE INVENTION

In view of the above, an object of the present invention is to suppress the number of masks when forming an Lov region and an Loff region, and further, to easily form an Lov region and an Loff region at desired locations. Further, an object of the present invention is to realize a crystalline TFT in which good characteristics can be obtained in both an on state and an off state. Another object of the present invention is to realize a high reliability semiconductor display device having a semiconductor circuit formed by this type of crystalline TFT.

An impurity is added to a semiconductor layer by using a self-aligning manner in which a gate electrode is utilized, and by using a mask, forming an Lov region and an Loff region. The gate electrode is formed from a two layer conductive film, and a layer closer to a semiconductor layer (a first gate electrode) is made longer in a channel longitudinal direction than a layer farther from the semiconductor layer (a second gate electrode).

Note that, in this specification, the term channel longitudinal direction refers to a direction between a source region and a drain region in which a carrier moves.

The lengths of the first gate electrode and the second gate electrode in the channel longitudinal direction (carrier movement direction) (hereafter referred to simply as the gate electrode width) differ in the present invention. By performing ion injection with the first gate electrode and the second gate electrode as masks, and utilizing the difference in ion penetration depth due to the difference in the thicknesses of the gate electrodes, it is possible to make the ion concentration within the semiconductor layers located beneath the second gate electrode lower than the ion concentration within the semiconductor layers positioned below the first gate electrode and not located below the second gate electrode. In addition, it is possible to make the ion concentration within the semiconductor layers located below the first gate electrode and not positioned below the second gate electrode lower than the ion concentration of the semiconductor layers not located below the first gate electrode.

Further, the Loff region is formed using masks, and therefore only the width of the first gate electrode and the width of the second gate electrode must be controlled by etching, and control of the location of the Loff region and the location of the Lov region becomes easy compared to that of conventional examples. Consequently, minute positional alignment of the Lov region and the Loff region becomes easy, and it also becomes easy to manufacture a TFF having desired characteristics.

Structures of the present invention are shown below.

According to the present invention, there is provided a semiconductor display device comprising: a semiconductor layer formed on an insulating surface; a gate insulating film connected to the semiconductor layer; a first gate electrode connected to the gate insulating film, a second gate electrode connected to the first gate electrode; and a liquid crystal cell, characterized in that:

the semiconductor layer has: a channel forming region; an LDD region contacting the channel forming region; and a source region and a drain region contacting the LDD region;

the width of the first gate electrode in the longitudinal direction of the channel is larger than the width of the second gate electrode in the longitudinal direction of the channel;

the LDD region overlaps with the first gate electrode, sandwiching the gate insulating film;

the liquid crystal cell has: a pixel electrode; an opposing electrode; and a liquid crystal formed between the pixel electrode and the opposing electrode; and the source region or the drain region is electrically connected to the pixel electrode.

According to the present invention, there is provided a semiconductor display device comprising: a semiconductor layer formed on an insulating surface; a gate insulating film connected to the semiconductor layer; a first gate electrode connected to the gate insulating film; a second gate electrode connected to the first gate electrode; and a liquid crystal cell, characterized in that:

the semiconductor layer has: a channel forming region: an LDD region contacting the channel forming region: and a source region and a drain region contacting the LDD region;

the width of the first gate electrode in the longitudinal direction of the channel is larger than the width of the second gate electrode in the longitudinal direction of the channel;

the LDD region overlaps with the first gate electrode, sandwiching the gate insulating film;

the channel forming region overlaps with the second gate electrode, sandwiching the gate insulating film the liquid crystal cell has: a pixel electrode; an opposing electrode; and a liquid crystal formed between the pixel electrode and the opposing electrode; and the source region or the drain region is electrically connected to the pixel electrode.

According to the present invention, there is provided a semiconductor display device comprising: a TFT having a semiconductor layer formed on an insulating surface, a gate insulating film connected to the semiconductor layer, a first gate electrode connected to the gate insulating film, and a second gate electrode connected to the first gate electrode; and a liquid crystal cell, characterized in that:

the width of the first gate electrode in the longitudinal direction of the channel is larger than the width of the second gate electrode in the longitudinal direction of the channel;

the first gate electrode has a tapered shape in cross section at an edge portion;

the semiconductor layer has: a channel forming region; an LDD region contacting the channel forming region; and a source region and a drain region contacting the LDD region;

the LDD region overlaps with the first gate electrode, sandwiching the gate insulating film;

the channel forming region overlaps with the second gate electrode, sandwiching the gate insulating film;

the liquid crystal cell has: a pixel electrode; an opposing electrode; and a liquid crystal formed between the pixel electrode and the opposing electrode; and the source region or the drain region is electrically connected to the pixel electrode.

The present invention may be characterized in that the LDD region is formed in a self-aligning manner in accordance with the addition of an impurity element into the semiconductor layer with the second gate electrode as a mask.

The present invention may be characterized in that the impurity element concentration in the LDD region contains a region having a concentration gradient in a range from at least $1\times10^{17}$ to $1\times10^{18}$ atoms/cm$^3$, and that the impurity element concentration in the LDD region increases as the distance from the channel forming region increases.

According to the present invention, there is provided a semiconductor display device comprising: a pixel TFT and a driver circuit TFT, each having a semiconductor layer formed on an insulating surface, a gate insulating film connected to the semiconductor layer, a first gate electrode connected to the gate insulating film, and a second gate electrode connected to the first gate electrode; and a liquid crystal cell, characterized in that:

the width of the first gate electrodes in the longitudinal direction of the channel is larger than the width of the second gate electrodes in the longitudinal direction of the channel;

the semiconductor layer of the pixel TFT has: a channel forming region overlapping with the second gate electrode, sandwiching the gate insulating film; a first LDD region contacting the channel forming region and overlapping with the first gate electrode, sandwiching the gate insulating film; a second LDD region contacting the first LDD region; and a source region and a drain region contacting the second LDD region;

the semiconductor layer of the driver circuit TFT has: a channel forming region overlapping with the second gate electrode, sandwiching the gate insulating film; a third LDD region contacting the channel forming region and overlapping with the first gate electrode, sandwiching the gate insulating film; and a source region or a drain region contacting the third LDD region;

the liquid crystal cell has: a pixel electrode; an opposing electrode; and a liquid crystal formed between the pixel electrode and the opposing electrode; and the source region or the drain region of the pixel TFT is electrically connected to the pixel electrode.

According to the present invention, there is provided a semiconductor display device comprising: a pixel TFT and a driver circuit TFT, each having a semiconductor layer formed on an insulating surface, a gate insulating film connected to the semiconductor layer, a first gate electrode connected to the gate insulating film, and a second gate electrode connected to the first gate electrode: and a liquid crystal cell, characterized in that:

the width of the first gate electrodes in the longitudinal direction of the channel is larger than the width of the second gate electrodes in the longitudinal direction of the channel;

the first gate electrodes have a tapered shape in cross section at an edge portion;

the semiconductor layer of the pixel TFT has: a channel forming region overlapping with the second gate electrode, sandwiching the gate insulating film; a first LDD region contacting the channel forming region and overlapping with the first gate electrode, sandwiching the gate insulating film; a second LDD region contacting the first LDD region; and a source region and a drain region contacting the second LDD region;

the semiconductor layer of the driver circuit TFT has: a channel forming region overlapping with the second gate electrode, sandwiching the gate insulating film; a third LDD region contacting the channel forming region and overlapping with the first gate electrode, sandwiching the gate insulating film; and a source region or a drain region contacting the third LDD region:

the liquid crystal cell has: a pixel electrode; an opposing electrode; and a liquid crystal formed between the pixel electrode and the opposing electrode; and the source region or the drain region of the pixel TFT is electrically connected to the pixel electrode.

The present invention may be characterized in that the impurity element concentration in the first LDD region contains a region having a concentration gradient in a range from at least $1\times10^{17}$ to $1\times10^{18}$ atoms/cm$^3$, and that the impurity element concentration in the LDD region increases as the distance from the channel forming region increases.

The present invention may be characterized in that the impurity element concentration in the third LDD region contains a region having a concentration gradient in a range from at least $1\times10^{17}$ to $1\times10^{18}$ atoms/cm$^3$, and that the impurity element concentration in the LDD region increases as the distance from the channel forming region increases.

The present invention may be characterized in that the first LDD region or the third LDD region is formed in a self-aligning manner in accordance with the addition of the impurity element into the semiconductor layer with the second gate electrode as a mask.

According to the present invention, there is provided a semiconductor display device comprising: a semiconductor layer formed on an insulating surface; a gate insulating film; a first gate electrode; a second gate electrode; a first wiring; a second wiring; a first interlayer insulating film; a second interlayer insulating film; an intermediate wiring; and a liquid crystal cell, characterized in that:

the gate insulating film is formed on the insulating surface, covering the semiconductor layer;

the first gate electrode and the first wiring are formed contacting the gate insulating film;

the second gate electrode and the second wiring are formed contacting the first gate electrode and the first wiring, respectively;

the first gate electrode and the first wiring are formed from a first conductive film;

the second gate electrode and the second wiring are formed from a second conductive film;

the first interlayer insulating film is formed covering: the first gate electrode and the second gate electrode; the first wiring and the second wiring; and the gate insulating film;

the second interlayer insulating film is formed on the first interlayer insulating film;

the intermediate wiring is formed covering the second interlayer insulating film and so as to contact the first interlayer insulating film through a contact hole formed in the second interlayer insulating film;

the intermediate wiring overlaps with the second wiring, sandwiching the first interlayer insulating film, in the contact hole;

the semiconductor layer has: a channel forming region; an LDD region contacting the channel forming region; and a source region and a drain region contacting the LDD region;

the width of the first gate electrode in the longitudinal direction of the channel is larger than the width of the second gate electrode in the longitudinal direction of the channel;

the channel forming region overlaps with the second gate electrode, sandwiching the gate insulating film;

the LDD region overlaps with the first gate electrode, sandwiching the gate insulating film;

the liquid crystal cell has: a pixel electrode; an opposing electrode; and a liquid crystal formed between the pixel electrode and the opposing electrode; and the source region or the drain region is electrically connected to the pixel electrode.

According to the present invention, there is provided a semiconductor display device comprising: a semiconductor layer formed on an insulating surface; a gate insulating film; a first gate electrode; a second gate electrode; a first wiring; a second wiring; a first interlayer insulating film; a second interlayer insulating film; an intermediate wiring; and a liquid crystal cell, characterized in that:

the gate insulating film is formed on the insulating surface, covering the semiconductor layer;

the first gate electrode and the first wiring are formed contacting the gate insulating film;

the second gate electrode and the second wiring are formed contacting the first gate electrode and the first wiring, respectively;

the first gate electrode and the first wiring are formed from a first conductive film;

the second gate electrode and the second wiring are formed from a second conductive film;

the first interlayer insulating film is formed covering: the first gate electrode and the second gate electrode; the first wiring and the second wiring; and the gate insulating film;

the second interlayer insulating film is formed on the first interlayer insulating film;

the intermediate wiring is formed covering the second interlayer insulating film and so as to contact the first interlayer insulating film through a first contact hole formed in the second interlayer insulating film:

the intermediate wiring overlaps with the second wiring, sandwiching the first interlayer insulating film, in the first contact hole;

the semiconductor layer has: a channel forming region; an LDD region contacting the channel forming region; and a source region and a drain region contacting the LDD region;

the LDD region overlaps with the first gate electrode, sandwiching the gate insulating film;

the channel forming region overlaps with the second gate electrode, sandwiching the gate insulating film;

the intermediate wiring is connected to the source region or the drain region through a second contact hole formed in: the gate insulating film; the first interlayer insulating film; and the second interlayer insulating film;

the liquid crystal cell has: a pixel electrode; an opposing electrode; and a liquid crystal formed between the pixel electrode and the opposing electrode; and the source region or the drain region of the pixel TFT is electrically connected to the pixel electrode.

According to the present invention, there is provided a semiconductor display device comprising: a semiconductor layer formed on an insulating surface; a gate insulating film; a first gate electrode; a second gate electrode; a first wiring; a second wiring; a first interlayer insulating film; a second interlayer insulating film; an intermediate wiring; a shielding film; and a liquid crystal cell, characterized in that:

the gate insulating film is formed on the insulating surface, covering the semiconductor layer;

the first gate electrode and the first wiring are formed contacting the gate insulating film;

the second gate electrode and the second wiring are formed contacting the first gate electrode and the first wiring, respectively;

the first gate electrode and the first wiring are formed from a first conductive film;

the second gate electrode and the second wiring are formed from a second conductive film;

the first interlayer insulating film is formed covering: the first gate electrode and the second gate electrode; the first wiring and the second wiring; and the gate insulating film;

the second interlayer insulating film is formed on the first interlayer insulating film;

the intermediate wiring is formed covering the second interlayer insulating film and so as to contact the first interlayer insulating film through a contact hole formed in the second interlayer insulating film;

the intermediate wiring overlaps with the second wiring, sandwiching the first interlayer insulating film, in the contact hole;

the semiconductor layer has: a channel forming region; an LDD region contacting the channel forming region; and a source region and a drain region contacting the LDD region;

the LDD region overlaps with the first gate electrode, sandwiching the gate insulating film;

the channel forming region overlaps with the second gate electrode, sandwiching the gate insulating film;

the shielding film is formed from the same conductive film as the intermediate wiring;

the shielding film is formed on the second interlayer insulating film so as to overlap with the channel forming region;

the liquid crystal cell has: a pixel electrode; an opposing electrode; and a liquid crystal formed between the pixel electrode and the opposing electrode; and the source region or the drain region is electrically connected to the pixel electrode.

According to the present invention, there is provided a semiconductor display device comprising: a semiconductor layer formed on an insulating surface; a sate insulating film; a first-ate electrode; a second gate electrode; a first wiring; a second wiring; a first interlayer insulating film; a second interlayer insulating film; an intermediate wiring; a shielding film: and a liquid crystal cell, characterized in that:

the gate insulating film is formed on the insulating surface, covering the semiconductor layer;

the first gate electrode and the first wiring are formed contacting the gate insulating film;

the second gate electrode and the second wiring are formed contacting the first gate electrode and the first wiring, respectively;

the first gate electrode and the first wiring are formed from a first conductive film;

the second gate electrode and the second wiring are formed from a second conductive film;

the first interlayer insulating film is formed covering: the first gate electrode and the second gate electrode; the first wiring and the second wiring; and the gate insulating film;

the second interlayer insulating film is formed on the first interlayer insulating film;

the intermediate wiring is formed covering the second interlayer insulating film and so as to contact the first interlayer insulating film through a first contact hole formed in the second interlayer insulating film;

the intermediate wiring overlaps with the second wiring, sandwiching the first interlayer insulating film, in the first contact hole;

the semiconductor layer has: a channel forming region; an LDD region contacting the channel forming region; and a source region and a drain region contacting the LDD region;

the LDD region overlaps with the first gate electrode, sandwiching the gate insulating film;

the channel forming region overlaps with the second gate electrode, sandwiching the gate insulating film;

the intermediate wiring is connected to the source region or the drain region through a second contact hole formed in: the gate insulating film: the first interlayer insulating film; the second interlayer insulating film;

the shielding film is formed from the same conductive film as the intermediate wiring;

the shielding film is formed on the second interlayer insulating film so as to overlap with the channel forming region;

the liquid crystal cell has: a pixel electrode; an opposing electrode; and a liquid crystal formed between the pixel electrode and the opposing electrode; and the source region or the drain region is electrically connected to the pixel electrode.

According to the present invention, there is provided a semiconductor display device comprising: a light shielding film formed on a substrate; an insulating film formed on the substrate, covering the light shielding film; a semiconductor layer formed on the insulating film; a gate insulating film contacting the semiconductor layer; a first gate electrode contacting the gate insulating film; a second gate electrode contacting the first gate electrode; and a liquid crystal cell, characterized in that:

the semiconductor layer has: a channel forming region; an LDD region connected to the channel forming region; and a source region and a drain region connected to the LDD region;

the LDD region overlaps with the first gate electrode, sandwiching the gate insulating film;

the channel forming region overlaps with the second gate electrode, sandwiching the gate insulating film;

the light shielding film overlaps with the channel forming region through the insulating film;

the liquid crystal cell has: a pixel electrode; an opposing electrode; and a liquid crystal formed between the pixel electrode and the opposing electrode; and the source region or the drain region is electrically connected to the pixel electrode.

According to the present invention, there is provided a semiconductor display device comprising: a light shielding film formed on a substrate; an insulating film formed on the substrate, covering the light shielding film; a semiconductor layer formed on the insulating film; a gate insulating film contacting the semiconductor layer; a first gate electrode contacting the gate insulating film; a second gate electrode contacting the first gate electrode; and a liquid crystal cell, characterized in that:

the semiconductor layer has: a channel forming region; an LDD region connected to the channel forming region; and a source region and a drain region connected to the LDD region;

the LDD region overlaps with the first gate electrode, sandwiching the gate insulating film;

the channel forming region overlaps with the second gate electrode, sandwiching the gate insulating film;

the light shielding film overlaps with the channel forming region through the insulating film;

the liquid crystal cell has: a pixel electrode; an opposing electrode; and a liquid crystal formed between the pixel electrode and the opposing electrode; and the source region or the drain region is electrically connected to the pixel electrode.

The present invention may be characterized in that the insulating film is leveled in accordance with CMP polishing.

The present invention may be a video camera, an image playback device, a head mounted display, or a personal computer, characterized by using the semiconductor display device.

According to the present invention, there is provided a method of manufacturing a semiconductor display device, comprising the steps of:

forming a semiconductor layer on an insulating surface;

forming a gate insulating film so as to contact the semiconductor layer;

forming a first conductive film so as to contact the gate insulating film;

forming a second conductive film so as to contact the first conductive film:

patterning the first conductive film and the second conductive film, forming a first gate electrode and a second gate electrode;

adding a first impurity from the first gate electrode and second gate electrode of the semiconductor layer to the semiconductor layer;

forming a mask on the semiconductor layer, covering the first gate electrode and the second gate electrode, and forming: a channel forming region; a first LDD region contacting the channel forming region; a second LDD region contacting the first LDD region; and a source region and a drain region contacting the second LDD region, within the semiconductor layer, by adding a second impurity, having the same conductivity type as the first impurity, from the mask formed on the semiconductor layer;

forming an interlayer insulating film composed of a single layer or a plurality of layers, covering the semiconductor layer, the first gate electrode, and the second gate electrode;

forming a contact hole in the interlayer insulating film; and forming a pixel electrode electrically connected to the source region or the drain region through the contact hole: characterized in that;

the first gate electrode is longer than the second gate electrode in the channel longitudinal direction;

the channel forming region overlaps with the second gate electrode, sandwiching the gate insulating film; and the first LDD region overlaps with the first gate electrode, sandwiching the gate insulating film.

According to the present invention, there is provided a method of manufacturing a semiconductor display device, comprising the steps of:

forming a semiconductor layer on an insulating surface;

forming a gate insulating film so as to contact the semiconductor layer;

forming a first conductive film so as to contact the gate insulating film;

forming a second conductive film so as to contact the first conductive film;

patterning the first conductive film and the second conductive film, forming a first gate electrode and a second gate electrode;

adding a first impurity from the first gate electrode and second gate electrode of the semiconductor layer to the gate electrode;

forming a mask on the semiconductor layer, covering the first gate electrode and the second gate electrode, and forming: a channel forming region; a first LDD region contacting the channel forming region; a second LDD region contacting the first LDD region; and a source region and a drain region contacting the second LDD region, within the semiconductor layer, by adding a second impurity, having the same conductivity type as the first impurity, from the mask formed on the semiconductor layer;

forming an interlayer insulating film composed of a single layer or a plurality of layers, covering the semiconductor layer, the first gate electrode, and the second gate electrode;

forming a contact hole in the interlayer insulating film; and forming a pixel electrode electrically connected to the source region or the drain region through the contact hole; characterized in that;

the first gate electrode is longer than the second gate electrode in the channel longitudinal direction;

the channel forming region overlaps with the second gate electrode, sandwiching the gate insulating film; and the first LDD region overlaps with the first gate electrode, sandwiching the gate insulating film.

According to the present invention, there is provided a method of manufacturing a semiconductor display device, comprising the steps of:

forming a semiconductor layer on an insulating surface;

forming a gate insulating film so as to contact the semiconductor layer;

forming a first shape first conductive layer so as to contact the gate insulating film, and a first shape second conductive layer;

etching the first shape first conductive layer and the first shape second conductive layer, forming a first gate electrode having a tapered portion and a second gate electrode having a tapered portion;

adding an impurity element which imparts a single conductivity type into the semiconductor layer, passing through the gate insulating film, and forming a second LDD region; and at the same time adding an impurity element which imparts a single conductivity type into the semiconductor layer, passing through the tapered portion of the first gate electrode, forming a first LDD region in which the impurity concentration increases toward an edge portion of the semiconductor layer;

adding an impurity element which imparts a single conductivity type with the first gate electrode having the tapered portion and the second gate electrode having the tapered portion as masks, forming a source region or a drain region;

forming an interlayer insulating film composed of one layer or a plurality of layers, covering: the semiconductor layer; the first gate electrode; and the second gate electrode;

forming a contact hole in the interlayer insulating film; and forming a pixel electrode electrically connected to the source region or the drain region through the contact hole.

According to the present invention, there is provided a method of manufacturing a semiconductor display device, comprising the steps of:

forming a semiconductor layer on an insulating surface;

forming a gate insulating film so as to contact the semiconductor layer;

forming a first conductive film so as to contact the gate insulating film;

forming a second conductive film so as to contact the first conductive film;

etching the second conductive film, forming a first shape second conductive layer;

etching the first conductive film, forming a first shape first conductive layer;

etching the first shape first conductive layer and the first shape second conductive layer, forming a first gate electrode having a tapered portion and a second gate electrode having a tapered portion;

adding an impurity element which imparts a single conductivity type into the semiconductor layer, passing through the gate insulating film, and forming a second LDD region; and at the same time adding an impurity element which imparts a single conductivity type into the semiconductor layer, passing through the tapered portion of the first gate electrode, forming a first LDD region in which the impurity concentration increases toward an edge portion of the semiconductor layer;

adding an impurity element which imparts a single conductivity type with the first gate electrode having the tapered portion and the second gate electrode having the tapered portion as masks, forming a source region or a drain region;

forming an interlayer insulating film composed of one layer or a plurality of layers, covering: the semiconductor layer; the first gate electrode; and the second gate electrode;

forming a contact hole in the interlayer insulating film; and forming a pixel electrode electrically connected to the source region or the drain region through the contact hole.

BRIEF DESCRIPTION OF THE DRAWINGS

In the accompanying drawings:

FIGS. 3A to 3D are diagrams showing a process of manufacturing a liquid-crystal display device of the present invention;

FIGS. 4A to 4D are diagrams showing the process of manufacturing the liquid crystal display device of the present invention;

FIGS. 5A and 5B are diagrams showing the process of manufacturing the liquid crystal display device of the present invention;

DETAILED DESCRIPTION OF THE PREFERRED EMBODIMENTS

Embodiment Mode

Figure 1A:
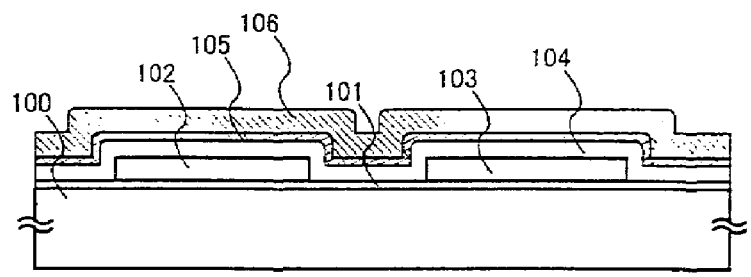
FIGS. 1A to 1F are diagrams showing a process of manufacturing a liquid crystal display device of the present invention.

A structure of a thin film transistor of the present invention, and a method of manufacturing the thin film transistor are shown in FIGS. 1A to 1F.

A base film 101 is formed on a substrate 100. The base film 101 need not be formed, but the formation of the base film 101 is effective in preventing impurity diffusion from the substrate 100 into semiconductor layers. Semiconductor layers 102 and 103 are then formed on the base film 101 from a crystalline semiconductor film manufactured by a known method.

A gate insulating film 104 is formed so as to cover the semiconductor layers 102 and 103. A first conductive film 105 and a second conductive film 106 are then formed on the gate insulating film 104 in order to form gate electrodes. Note that it is necessary for the first conductive film 105 and the second conductive film 106 to be formed from conductive materials which have selectivity during etching. (See FIG. 1A.)

Resist masks 107 and 108 are formed next over the semiconductor layers 102 and 103. First shape conductive layers 109 and 110 (first conductive layers 109a and 110a, and second conductive layers 109b and 110b) are then formed by etching (a first etching process) the first conductive film 105) and the second conductive film 106 using the masks 107 and 108. (See FIG. 1B.)

Figure 1B:
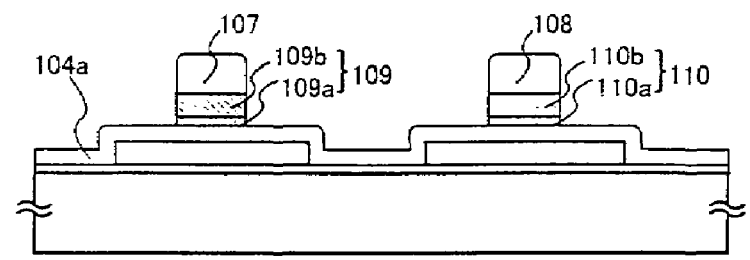
Figure 2A:
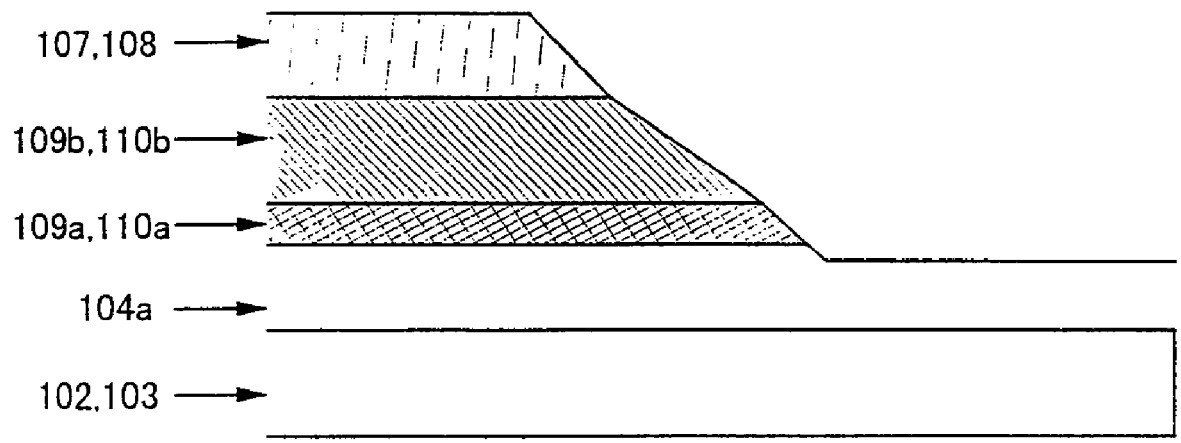
FIGS. 2A and 2B are blow-up diagrams of TFT gate electrodes.

A blow-up diagram of the first shape conductive layers 109 and 110 of FIG. 1B is shown in FIG. 2A. Edge portions of the first conductive layers 109a and 110a, and edge portions of the second conductive layers 109b and 110b become tapered as shown in FIG. 2A. Further, the gate insulating film 104 is etched and becomes thinner in regions not covered by the first shape conductive layers 109 and 110, becoming a first shape gate insulating film 104a.

Figure 1C:
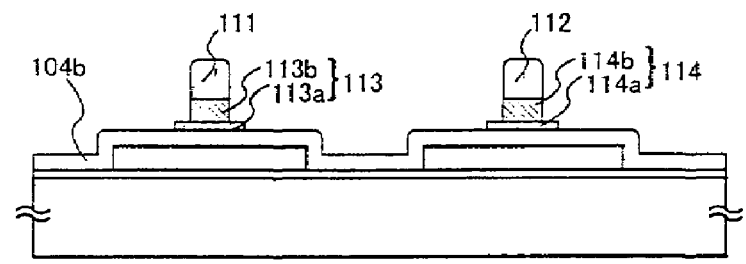

A second etching process is performed next as shown in FIG. 1C. The first shape second conductive layers 109b and 110b are anisotropically etched, and the first conductive layers 109a and 110a are anisotropically etched at a slower etching speed than that of the second conductive layers 109b and 110b, forming second shape conductive layers 113 and 114 (first conductive layers 113a and 114a, and second conductive layers 113b and 114b).

Figure 2B:
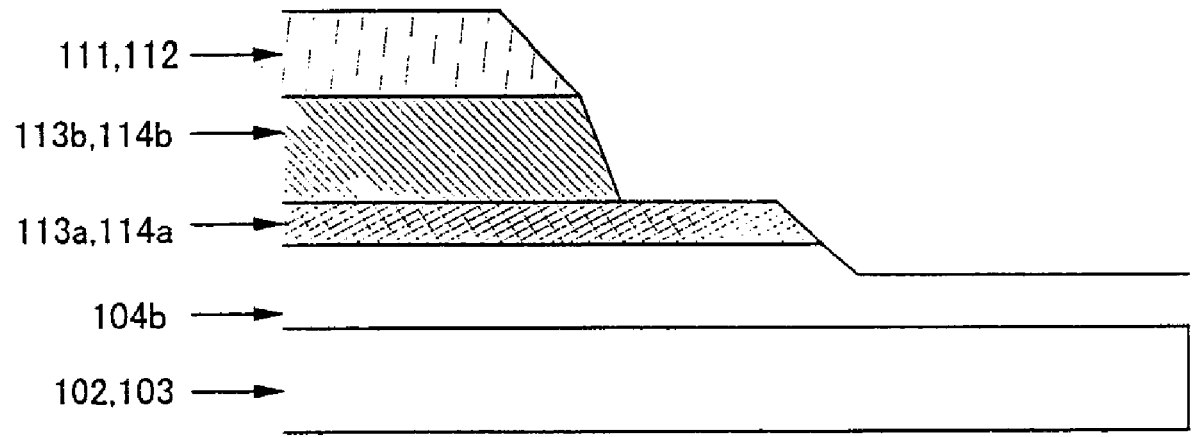

A blow-up diagram of the second shape conductive layers 113 and 114 of FIG. 1C is shown in FIG. 2B here. The second conductive layers 113b and 114b are etched more than the first conductive layers 113a and 114a by the second etching process, as shown in FIG. 2B. Further, the masks 107 and 108 are etched by the second etching process becoming masks 111 and 112. The first shape gate insulating film 104a is further etched and becomes thinner in regions not covered by the second shape conductive layers 113 and 114, becoming a second shape gate insulating film 104b.

Figure 1D:
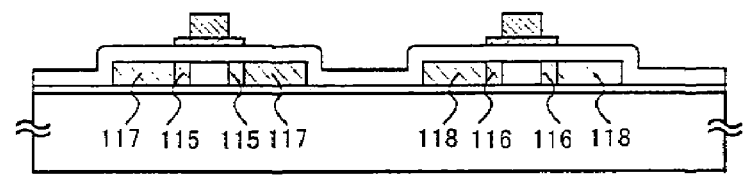
Figure 1E:
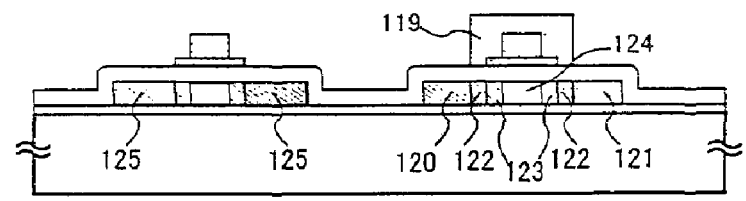

The masks 111 and 112 are removed, and a first doping process is performed on the semiconductor layers 102 and 103, as shown in FIG. 1D, adding an impurity element which imparts n-type conductivity. Doping is performed using the second shape conductive layers 113 and 114 as masks against the impurity element. Further, doping is performed so as to add the impurity element in regions under the second conductive layers 113a and 114a.

First impurity regions 115 and 116, which overlap with the second conductive layers 113a and 114a, and second impurity regions 117 and 118, which have a higher impurity concentration than the first impurity regions, are thus formed. Note that, although the impurity element which imparts n-type conductivity is added after removing the masks 111 and 112 in this embodiment mode, the present invention is not limited to this. The masks 111 and 112 may also be removed after adding the impurity element which imparts n-type conductivity in the process of FIG. 1D.

A mask 119 is then formed from resist over the semiconductor layer 103 so as to cover the second shape conductive layer 114. The mask 119 overlaps with a portion of the second impurity region 118, sandwiching the second shape gate insulating film 104b. A second doping process is then performed, adding an impurity element which imparts n-type conductivity. Doping of the n-type conductivity imparting impurity element is performed at conditions in which the dosage is increased to more than that of the first doping process, and in which the acceleration voltage is set low. In addition to a channel forming region 124 and an Lov region 123, a source region 120, a drain region 121, and an Loff region 122 are formed in the semiconductor layer 103 in a self-aligning manner by the second doping process. Further, a third impurity region 125 is formed in the semiconductor layer 102 by the second doping process with the second shape first conductive layer 113a as a mask. (See FIG. 1E.)

It is possible to freely set the size of the Loff region 122 by controlling the size of the mask 119 in the present invention.

Figure 1F:
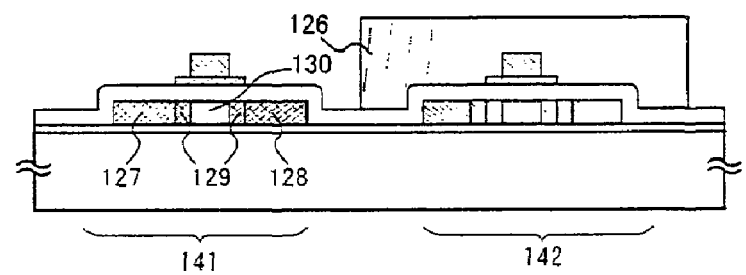

The entire surface of the semiconductor layer 103, which forms an n-channel TFT, is then covered by a resist mask 126 as shown in FIG. 1F. A source region 127, a drain region 128, an Lov region 129, into which an impurity element which imparts p-type conductivity is added in accordance with a third doping process using the second shape conductive layer 113 as a mask against the impurity element; and a channel forming region 130 are then formed in a self-aligning manner in the p-channel TFT forming semiconductor layer 102.

The n-type conductivity imparting impurity element is already added to the source region 127, the drain region 108, and the Lov region 129 at differing concentrations, but the conductivity types of the source region 127, the drain region 128, and the Lov region 129 are set to p-type by adding the p-type conductivity imparting impurity element at a concentration which is sufficiently higher than the concentration of the impurity element which imparts n-type conductivity.

The impurity regions (source regions, drain regions, Lov regions, and Loff regions) are thus formed in the semiconductor layers 102 and 103 by the above processes. The second shape conductive layers 113 and 114 overlapping with the semiconductor layers 102 and 103 function as gate electrodes. The second shape first conductive layers 113a and 114a are referred to as a first gate electrode, and the second shape second conductive layers 113b and 114b are referred to as a second gate electrode.

A process of activating the impurity elements added to the respective semiconductor layers is performed next with a goal of controlling conductivity. However, it is preferable to perform activation after forming an interlayer insulating film (having silicon as its main constituent) in order to protect portions such as wirings if the conductive material used in the first conductive film 105 and the second conductive film 106 is weak with respect to heat.

In addition, heat treatment is performed in an atmosphere containing between 3 and 100% hydrogen, performing hydrogenation of the semiconductor layers 102 and 103. This process is one of terminating dangling bonds in the semiconductor layers by hydrogen which is thermally excited. Plasma hydrogenation (using hydrogen which is excited by a plasma) may also be performed as another means of hydrogenation.

A p-channel TFT 141 and an n-channel TFT 142 are completed when the above processes are finished.

Note that, although the surfaces are shown to be level in FIGS. 1A to 1F, and 2A and 2B, for regions in which the lengths of the second shape first gate electrodes 113a and 114a are longer compared to the lengths of the second gate electrodes 113b and 114b in the channel longitudinal direction, a taper having an extremely small taper angle exists. Note also that it is also possible to make this level, depending upon the etching conditions.

The lengths in the channel longitudinal direction (the direction in which a carrier moves) of the first gate electrode and the second gate electrode (hereafter referred to simply as gate electrode width) thus differ with the present invention, as stated above. The difference in ion penetration depth due to the differing thicknesses of the gate electrodes, in accordance with performing ion injection with the first gate electrode and the second gate electrode as masks is utilized. It therefore becomes possible to make the ion concentration within the semiconductor layers which are arranged under the second gate electrode lower than the ion concentration of the semiconductor layers which are arranged under the first gate electrode but not positioned under the second gate electrode. In addition, it is possible to make the ion concentration within the semiconductor layers located under the first gate electrode, but not under the second gate electrode, lower than the ion concentration of the semiconductor layers which are not located under the first gate electrode.

Further, in order to form the Loff region using a mask, only the width of the first gate electrode and the width of the second gate electrode must be controlled by etching, and therefore control of the position of the Loff region and the Lov region becomes easy compared to the conventional examples. Precise positional alignment of the Lov region and the Loff region therefore becomes easy, and it also becomes easy to manufacture TFTs having desired characteristics.

EMBODIMENTS

Embodiments of the Present Invention are Explained Below.

Embodiment 1

A method of manufacturing a pixel portion, and TFTs (n-channel TFTs and p-channel TFTs) of a driver circuit formed in the periphery of the pixel portion, at the same time and on the same substrate is explained in detail in Embodiment 1.

First, as shown in FIG., 3A, a base film 301 made of an insulating film such as a silicon oxide film, a silicon nitride film, or a silicon oxynitride film is formed on a substrate 300 made from glass, such as barium borosilicate glass or aluminum borosilicate glass, typically Corning Corp. #7059 glass or #1737 glass, or quartz. For example, a silicon oxynitride film manufactured from $SiH_4$, $NH_3$, and $N_2O$ by plasma CVD is formed with a thickness of 10 to 200 nm (preferably from 50 to 100 nm), and a hydrogenated silicon oxynitride film with a thickness of 50 to 200 nm (preferably between 100 and 150 nm), manufactured from $SiH_4$ and $N_2O$, is similarly formed and laminated. Note that the two layer structure base film 301 is shown as one layer in FIG. 3A. An example in which the base film 301 is of a two layer structure is shown in Embodiment 1, but it may also be formed as a single layer of one of the above insulating films, or a lamination structure in which three or more layers are laminated.

Semiconductor layers 302 to 304 are formed by a crystalline semiconductor film manufactured by using a laser crystallization method on a semiconductor film having an amorphous structure, or by using a known thermal crystallization method. The thickness of the semiconductor layers 302 to 304 is set from 25 to 80 nm (preferably between 30 and 60 nm). There are no limitations on the crystalline semiconductor film material, but it is preferable to form the film from a semiconductor material such as silicon or a silicon germanium (SiGe) alloy.

Regarding known crystallization methods, there are a thermal crystallization method using an electric furnace, a laser annealing crystallization method using laser light, a lamp annealing crystallization method using infrared light, and a crystallization method using a catalyst metal.

A laser such as a pulse emission type or continuous emission type excimer laser, a YAG laser, or a $YVO_4$ laser can be used as a laser light source used in the laser crystallization method for manufacturing a crystalline semiconductor film. A method of condensing laser light emitted from a laser emission device into a linear shape by an optical system and then irradiating the light to the semiconductor film may be employed when these types of lasers are used. The crystallization conditions may be suitably selected by the operator, but, the pulse emission frequency is set to 30 Hz, and the laser energy density is set form 100 to 400 $mJ/cm^2$ (typically between 200 and 300 $mJ/cm^2$) when using the excimer laser.

Further, the second harmonic is utilized when using the YAG laser, the pulse emission frequency is set from 1 to 10 KHz, and the laser energy density may be set from 300 to 600 $mJ/cm^2$ (typically between 350 and 500 $mJ/cm^2$). The laser light which has been condensed into a linear shape with a width of 100 to 1000 µm, for example 400 µm, is then irradiated over the entire surface of the substrate. This is performed with an overlap ratio of 80 to 98% for the linear shape laser light.

A gate insulating film 305 is formed covering the semiconductor layers 302 to 304. An insulating film containing silicon is formed with a thickness of 40 to 150 nm by plasma CVD or sputtering as the gate insulating film 305. A 120 nm thick silicon oxynitride film is formed in Embodiment 1. The gate insulating film is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics of the silicon oxide film thus manufactured as a gate insulating film can be obtained by subsequently performing thermal annealing, at between 400 and 500° C.

A first conductive film 306 and a second conductive film 307 are then formed on the gate insulating film 305 in order to form gate electrodes. The first conductive film 306 is formed from Ta with a thickness of 50 to 100 nm, and the second conductive film 307 is formed by W having a thickness of 100 to 300 nm, in Embodiment 1.

The Ta film is formed by sputtering, and sputtering of a Ta target is performed by using Ar. If appropriate amounts of Xe and Kr are added to the Ar during sputtering, the internal stress of the Ta film will be relaxed, and film peeling can be prevented. The resistivity of an α phase Ta film is on the order of 20 µΩcm, and it can be used in the gate electrode, but the resistivity of a α phase Ta film is on the order of 180 µΩcm and it is unsuitable for the gate electrode. An α phase Ta film can easily be obtained if a tantalum nitride film, which possesses a crystal structure near that of α phase Ta, is formed with a thickness of 10 to 50 nm as a base for Ta in order to form the α phase Ta film.

The W film is formed by sputtering with W as a target. The W film can also be formed by thermal CVD using tungsten hexafluoride ($WF_6$). Whichever is used, it is necessary to make the film low resistant in order to use it as the gate electrode, and it is preferable that the resistivity of the W film be made equal to or less than 20 µΩcm. The resistivity can be lowered by enlarging the crystals of the W film, but for cases in which there are many impurity elements such as oxygen within the W film, crystallization is inhibited, and the film becomes high resistant. A W target having a purity of 99.9999% or 99.99% is thus used in sputtering. In addition, by forming the W film while taking sufficient care that no impurities from the inside of the gas phase are introduced at the time of film formation, a resistivity of 9 to 20 µΩcm can be achieved.

Note that, although the first conductive film 306 is Ta and the second conductive film 307 is W in Embodiment 1, the conductive films are not limited to these as long as conductive materials which have selectivity are used. The first conductive film 306 and the second conductive film 307 may both also be formed from an element selected from the group consisting of Ta, W, Ti, Mo, Al, and Cu, from an alloy material having one of these elements as its main constituent, or from a chemical compound of these elements. Further, a semiconductor film, typically a polysilicon film, into which an impurity element such as phosphorous is doped may also be used. Examples of preferable combinations other than that used in Embodiment 1 include: the first conductive film formed by tantalum nitride (TaN) and the second conductive film formed from W; the first conductive film formed by tantalum nitride (TaN) and the second conductive film formed from Al; and the first conductive film formed by tantalum nitride (TaN) and the second conductive film formed from Cu. (See FIG. 3B.)

Masks 308 to 311 are formed next from resist, and a first etching process is performed in order to form electrodes and wirings. An ICP (inductively coupled plasma) etching method is used in Embodiment 1. A gas mixture of $CF_4$, and $Cl_2$, is used as an etching gas, and a plasma is generated by applying a 500 W RF electric power (13.56 MHZ) to a coil shape electrode at 1 Pa. A 100 W RF electric power (13.56 MHZ) is also applied to the substrate side (test piece stage), effectively applying a negative self-bias voltage. The W film and the Ta film are both etched on the same order when $CF_4$ and $Cl_2$ are combined.

Note that, although not shown in FIG. 3C, edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. Further, although not shown in FIG. 3C, regions of the gate insulating film 305 not covered by first shape conductive layers 312 to 315 are made thinner by approximately 20 to 50 nm by etching, forming a first shape gate insulating film 305a.

The first shape conductive layers 312 to 315 (first conductive layers 312a to 315a and second conductive layers 312b to 315b) are thus formed from the first conductive layer and the second conductive layer in accordance with the first etching process.

A second etching process is performed next, as shown in FIG. 3D. The ICP etching method is similarly used, a mixture of $CF_4$, $Cl_2$, and $O_2$ is used as the etching gas, and a plasma is generated by supplying a 500 W RF electric power (13.56 MHZ) to a coil shape electrode at a pressure of 1 Pa. A 50W RF electric power (13.56 MHZ) is applied to the substrate side (test piece stage), and a self-bias voltage which is lower in comparison to that of the first etching process is applied. The W film is etched anisotropically under these etching conditions, and Ta (the first conductive layers) is anisotropically etched at a slower etching speed, forming second shape conductive layers 320 to 323 (first conductive layers 320a to 323a and second conductive layers 320b to 323b). Further, although not shown in FIG. 3D, the gate insulating film 305 is additionally etched on the order of 20 to 50 nm, becoming thinner, in regions not covered by the second shape conductive layers 320 to 323, forming a second shape gate insulating film 305b. The masks 308 to 311 are etched by the second etching process, becoming masks 316 to 319.

The etching reaction of the W film and the Ta film in accordance with the mixed gas of $CF_4$ and $Cl_2$ can be estimated from the radicals generated, and from the ion types and vapor pressures of the reaction products. Comparing the vapor pressures of W and Ta fluorides and chlorides, the W fluoride compound $WF_6$, is extremely high, and the vapor pressures of $WCl_5$, $TaF_5$, and $TaCl_5$ are of similar order. Therefore the W film and the Ta film are both etched by the $ClF_4$ and $Cl_2$ gas mixture. However, if a suitable quantity of $O_2$ is added to this gas mixture, $CF_4$ and $O_2$ react, forming CO and F. and a large amount of F radicals or F ions is generated. As a result, the etching speed of the W film having a high fluoride vapor pressure becomes high. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds between the W film and the Ta film, and it becomes possible to make the etching speed of the W film larger than that of the Ta film.

The masks 316 to 319 are removed, and a first doping process is performed as shown in FIG. 4A, adding an impurity element which imparts n-type conductivity. For example, doping may be performed at an acceleration voltage of 70 to 120 keV and with a dosage of $1\times10^{13}$ atoms/cm². The doping process is performed using the second conductive layers 320b to 322b as masks against the impurity element, so as to also add the impurity element in regions below the first conductive layers 321a to 322a. First impurity regions 325 to 327, which overlap with the first conductive layers 320a to 322a, and second impurity regions 328 to 330, which have a higher impurity concentration than the first impurity regions, are thus formed. Note that the n-type conductivity imparting element is added after removing the masks 316 to 319 in Embodiment 1, but the present invention is not limited to this. The impurity element which imparts n-type conductivity may also be added in the step of FIG. 4A. and then the masks 316 to 319 may be removed.

A mask 331 is next formed on the semiconductor layer 304 so as to cover the second conductive layer 318. A portion of the mask 331 overlaps with the second impurity region 330, sandwiching the second shape gate insulating film 305b. A second doping process is then performed, and an impurity element which imparts n-type conductivity is added. Doping of the n-type conductivity imparting impurity element is performed at conditions in which the dosage is raised higher than that of the first doping process, and at a low acceleration voltage. (See FIG. 4B.) Ion doping or ion injection may be performed for doping. Ion doping is performed under conditions of a dose amount from $1\times10^{13}$ to $5\times10^{14}$ atoms/cm² and an acceleration voltage of 60 to 100 keV. A periodic table group 15 element, typically phosphorous (P) or arsenic (As), is used as the impurity element which imparts n-type conductivity, and phosphorous (P) is used here. The second shape conductive layers 320 and 321 become masks with respect to the n-type conductivity imparting impurity element in this case, and source regions 332 to 334, drain regions 335 to 337, an intermediate region 338, and Lov regions 339 and 340 are formed in a self-aligning manner. Further, an Loff region 341 is formed in accordance with the mask 331. The impurity element which imparts n-type conductivity is added to the source regions 332 to 334, and to the drain regions 335 to 337 with a concentration in the range of $1\times10^{20}$ to $1\times10^{21}$ atoms/cm³.

It is possible to freely set the length of the Loff region 341 in the direction which the carrier moves by controlling the size of the mask 331 with the present invention.

The n-type conductivity imparting impurity element is added so as to form a concentration of $1\times10^{16}$ to $1\times10^{18}$ atoms/cm³ in the Loff region, and a concentration of $1\times10^{16}$ to $3\times10^{18}$ atoms/cm³ in the Lov regions.

Note that, in FIG. 4B, an impurity element which imparts n-type conductivity may also be doped at an acceleration voltage of 70 to 120 keV, in the state in which the mask 331 is formed on the semiconductor layer 304, before or after doping the n-type conductivity imparting impurity element under the above stated conditions. The concentration of the impurity element which imparts n-type conductivity is suppressed in the portion 341 which becomes the Loff region of the pixel TFT by the above process, and the concentration of the n-type conductivity imparting impurity element in the portion 340 which becomes the Lov region of the n-channel TFT used in the driver circuit can be increased. It is possible to reduce the off current in the pixel TFT by suppressing the concentration of the n-type conductivity imparting impurity element in the portion 341 which becomes the Loff region of the pixel TFT. Further, by increasing the concentration of the n-type conductivity imparting impurity element in the portion 340 which becomes the Lov region of the n-channel TFT used in the driver circuit, the degradation phenomenon caused by hot carriers, due to the hot carrier effect, generated in accordance with a high electric field in the vicinity of the drain, can be prevented. It is preferable that the concentration of the n-type conductivity imparting impurity element in the region 340 which becomes the Lov region of the n-channel TFT used in the driver circuit be from $5 \times 10^{17}$ to $5 \times 10^{19}$ atoms/cm$^3$.

A source region 340, a drain region 341, and a Lov region 342, into which An impurity element having a conductivity type which is the inverse of the above single conductivity type, are then formed in the p-channel TFT forming semiconductor layer 302, as shown in FIG. 4C. The second shape conductive layer 320 is used as a mask with respect to the impurity element, and the impurity regions are formed in a self-aligning manner. The entire surfaces of the semiconductor layers 303 and 304, which form n-channel TFTs, are covered by a resist mask 343 at this point. Phosphorous is already added in differing concentrations to the source region 340, the drain region 341, and the Lov region 342, and ion doping is performed here using diborane ($B_2H_6$), so that boron is also added to each of the regions with a concentration of $2 \times 10^{20}$ to $2 \times 10^{21}$ atoms/cm$^3$. In practice, the boron contained in the source region 340, the drain region 341, and the Lov region 342 is influenced by the film thickness of the conductive layers and the insulating film, which have a tapered shape in cross section at their edge portions above the semiconductor layers, similar to the second doping process. The concentration of the impurity element added also changes.

Impurity regions (source regions, drain regions, Lov regions, and Loff regions) are formed in the respective semiconductor layers 302 to 304 by the above processes. The second shape conductive layers 320 to 322 overlapping the semiconductor layers 302 to 304 function as gate electrodes. Further, the second shape conductive layer 323 functions as a capacitor wiring.

A process of activating the impurity elements added to the respective semiconductor layers is then performed, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 1 ppm, in a nitrogen atmosphere at 400 to 700° C., typically between 500 and 600° C. Heat treatment is performed for 4 hours at 500° C. in Embodiment 1. However, for cases in which the conductive material used in the first conductive layer 306 and the second conductive layer 307 is weak with respect to heat, it is preferable to perform activation after forming an interlayer insulating film (having silicon as its main constituent) in order to protect the gate electrodes, the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

A first interlayer insulating film 344 is formed next from a silicon oxynitride film having a thickness of 100 to 200 nm. A second interlayer insulating film 345 made from an organic insulating material is then formed on the first interlayer insulating film 344.

Contact holes are then formed in the second interlayer insulating film 345 over the capacitor wiring 323, exposing a portion of the first interlayer insulating film 344. An intermediate wiring 346 is then formed so as to contact the first interlayer insulating film 344 through the contact holes above the capacitor wiring 323. (See FIG. 4D.)

Next, a third interlayer insulating film 347 made from an organic insulating material is formed on the second interlayer insulating film 345.

Contact holes are then formed in the second shape gate insulating film 305*b*, the first interlayer insulating film 344, and the second interlayer insulating film 345, and source wirings 348 to 350 are formed so as to contact the source regions 360, 333, and 334 through the contact holes. Further, a drain wiring 351 is formed at the same time contacting the drain regions 361, 336. (See FIG. 5A.) The drain region 337 and the intermediate wiring 346 are electrically connected by the drain wiring 352.

Note that it is preferable to form the contact holes by dry etching using $CF_4$ and $O_2$ when the second shape gate insulating film 305*b*, the first interlayer insulating film 344, the second interlayer insulating film 345, and a third interlayer insulating film 347 are $SiO_2$, films or SiON films. Further, for cases in which the second shape gate insulating film 305*b*, the first interlayer insulating film 344, the second interlayer insulating film 345, and the third interlayer insulating film 347 are organic resin films, it is preferable to form the contact holes by dry etching using $CHF_3$ or by BHF (buffered hydrogen fluoride. HF $+NH_4F$). In addition, if the second shape gate insulating film 305*b*, the first interlayer insulating film 344, the second interlayer insulating film 345, and the third interlayer insulating film 347 are formed by different materials, it is preferable to change the method of etching and the etchant or etching gas type for each film. However, the contact holes may also be formed by using the same etching method and the same etchant or etching gas.

A storage capacitor is formed in a portion at which the first interlayer insulating film 344 is formed in contact between the capacitor wiring 323 and the intermediate wiring 346.

A fourth interlayer insulating film 353 is formed next from an organic resin. Organic resins such as polyimide, polyamide, acrylic, and BCB (benzocyclobutene) can be used. In particular, it is preferable to use acrylic, which has superior levelness, because the fourth interlayer insulating film 353 is formed with a strong implication of leveling. An acrylic film is formed in Embodiment 1 at a film thickness at which steps formed by the TFTs can be sufficiently leveled. The film thickness is preferable from 1 to 5 μm (more preferably between 2 and 4 μm).

A contact hole for reaching the intermediate wiring 352 is formed next in the fourth interlayer insulating film 353, and a pixel electrode 354 is formed. An indium tin oxide (ITO) film is formed with a thickness of 110 nm in Embodiment 1, and patterning is then performed, forming the pixel electrode 354. Further, a transparent conductive film in which between 2 and 20% zinc oxide (ZnO) is mixed with indium oxide may also be used. The pixel electrode 354 becomes a pixel electrode of a liquid crystal cell. (See FIG. 5B.)

Figure 6:
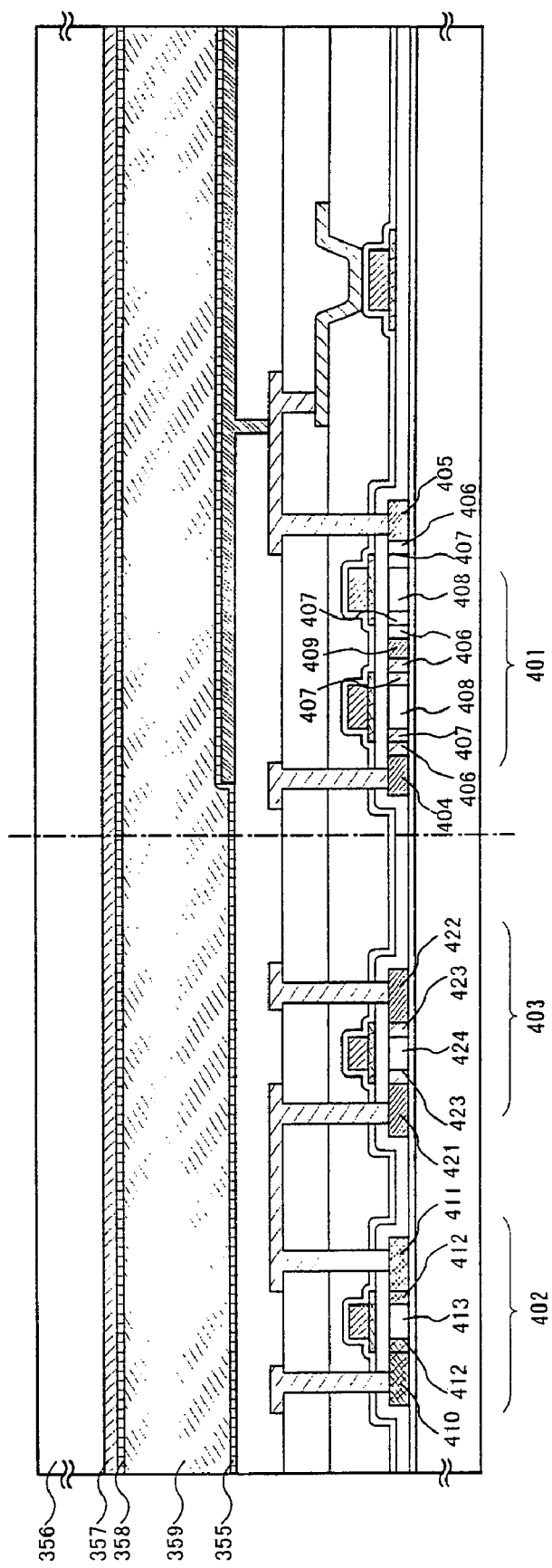
FIG. 6 is a diagram showing the process of manufacturing the liquid crystal display device of the present invention.

An orientation film 355 is formed next on an active matrix substrate in the state of FIG. 5B, as shown in FIG. 6. A polyimide resin is used normally in the orientation film of a liquid crystal display element. After forming the orientation film, a rubbing process is performed, giving the liquid crystal molecules a certain fixed pre-tilt angle. Further, although not shown in FIG. 6 spacers may be placed between an opposing substrate and the active matrix substrate.

On the other hand, an opposing electrode 357 and an orientation film 358 are formed on an opposing substrate 356 on the opposite side. Although not shown in FIG. 6, the opposing substrate 356 may also have a shielding film. In that case, the shielding film is formed with a thickness of 150 to 300 nm from a film such as a Ti film, a Cr film, or an Al film. The active matrix substrate, on which the pixel portion and the driver circuit are formed, and the opposing substrate are then joined by a sealant (not shown in the figure). A filler (not shown in the figure) is mixed into the sealant, and the two substrate are maintained at a uniform gap in accordance with the filler (or spacers, depending upon the circumstances). A liquid crystal material 359 is then injected between both the substrates. A known liquid crystal material may be used as the liquid crystal material. For example, in addition to a TN liquid crystal, a thresholdless antiferroelectric mixed liquid crystal displaying electro-optical response characteristics in which its transmittivity changes continuously with respect to an electric field can be used. There are also threshold less antiferroelectric mixed liquid crystals which display V-type electro-optical response characteristics. The active matrix liquid crystal display device shown in FIG. 6 is thus completed.

In Embodiment 1, a source region 404, a drain region 405, an Loff region 406, an Lov region 407, a channel forming region 408, and an intermediate region 409 are contained in a semiconductor layer of a pixel TFT 401. The Loff region 406 is formed so as not to overlap with the gate electrode 318 through the second shape gate insulating film 305b. Further, the Lov region 407 is formed so as to overlap with the gate electrode 318 through the second shape gate insulating film 305b. This type of structure is extremely effective in reducing the off current due to the hot carrier effect.

Further, a double gate structure is used for the pixel TFT 401 in Embodiment 1, but in the present invention, a single gate structure or a multi-gate structure for the pixel TFT may be applied. Two TFTs are effectively connected in series by using the double gate structure, giving the advantage of additionally reducing the off current.

Further, the pixel TFT 401 is an n-channel TFT in Embodiment 1, but a p-channel TFT may also be used.

Note that the active matrix substrate of Embodiment 1 displays an extremely high reliability and improved performance characteristics in accordance with the arrangement of optimally structured TFTs not only in the pixel portion, but also in the driver circuit portion.

First, a TFT having a structure in which hot carrier injection is reduced without a drop in its operating speed is used as an n-channel TFT 403 of a CMOS circuit forming the driver circuit portion. Note that the driver circuit referred to here contains circuits such as a shift register, a buffer, a level shifter, and a sampling circuit (sample and hold circuit). When performing digital driving, signal converter circuits such as a D/A converter circuit can also be included.

A semiconductor layer of the n-channel TFT (driver circuit n-channel TFT) 403 of the CMOS circuit contains a source region 421, a drain region 422, an Lov region 423, and a channel forming region 424 in Embodiment 1.

A semiconductor layer of a driver circuit p-channel TFT 402 contains a source region 410, a drain region 411, an Lov region 412, and a channel forming region 413. The Lov region 412 is formed so as to overlap with the gate electrode 320 through the second shape gate insulating film 305b. Note that the driver circuit p-channel TFT 402 does not have an Loff region in Embodiment 1, but a structure having an Loff region may also be used.

The lengths of the gate electrodes in the channel longitudinal direction (hereafter referred to simply as gate electrode width) thus differ with the present invention. Therefore, it is possible to make the ion concentration within the semiconductor layers arranged under the first gate electrode less than the ion concentration within the semiconductor layers not arranged under the first gate electrode by utilizing the difference in ion penetration depth, due to the differing gate electrode thicknesses, when performing ion injection using the gate electrodes as masks.

Further, the Loff regions are formed using a mask, and therefore only the width of the first gate electrode and the width of the second gate electrode must be controlled by etching. Control of the Loff region and Lov region positions becomes easier compared to the conventional examples. It therefore becomes easy to have precise positional alignment of the Lov regions and the Loff regions, and it becomes easy to manufacture TFTs having desired characteristics.

Further, it has been necessary to etch the gate insulating film and the first interlayer insulating film in order to form the contact hole for forming the drain wiring connected to the drain region of the pixel TFT with the conventional examples, and therefore it has been difficult to form the storage capacitor by the drain wiring, the capacitor wiring, and the first interlayer insulating film. However, the intermediate wiring is newly formed between the second interlayer insulating film and the third interlayer insulating film with the present invention, and therefore the storage capacitor can be formed by the intermediate wiring 352 connected to the drain wiring of the pixel TFT, the first interlayer insulating film 344, and the capacitor wiring 323 formed at the same time as the gate signal line.

Note that although a transmitting type liquid crystal display device is explained in Embodiment 1, the present invention is not limited to this, and a reflecting type liquid crystal display device may also be formed. Further, a case of using an n-channel TFT in the pixel TFT is explained in Embodiment 1, but the present invention is not limited to this, and a p-channel TFT may also be used for the pixel TFT.

Furthermore, a case of forming both an Lov region and an Loff region in the pixel TFT is explained in Embodiment 1, but a structure in which the pixel TFT has only an Lov region may also be used. In addition, a structure in which only an Lov region is formed in the driver circuit TFT is explained in Embodiment 1, but a structure in which both an Lov region and an Loff region are formed in the driver circuit TFT may also be used.

Embodiment 2

A top surface diagram of a pixel portion of a liquid crystal display device of the present invention is explained in Embodiment 2.

Figure 7A:
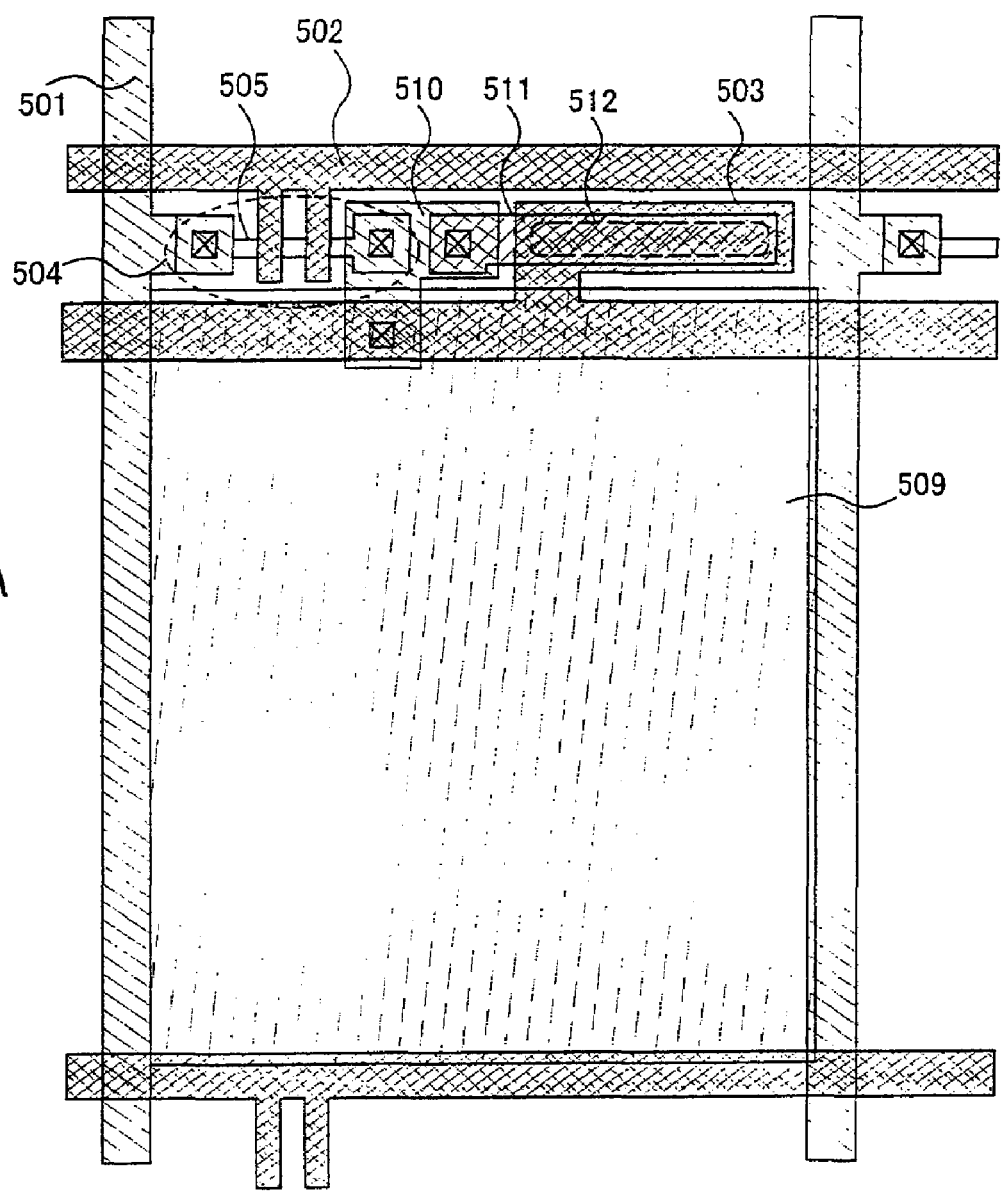
FIGS. 7A and 7B are a top surface view and a circuit diagram, respectively, of a pixel of a liquid crystal display device of the present invention.
Figure 7B:
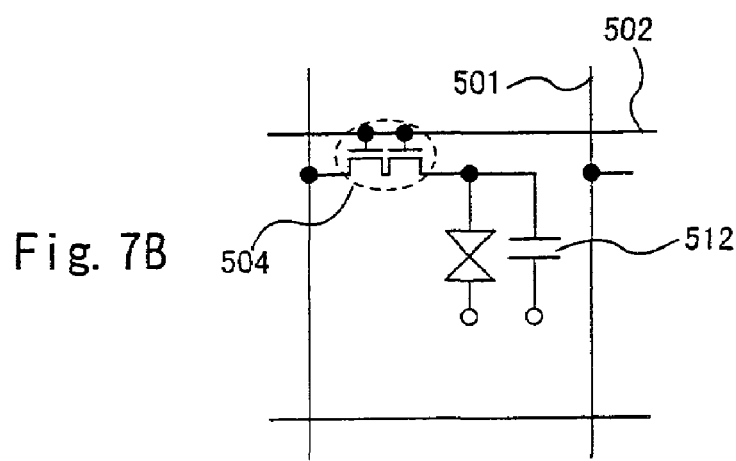

A top surface diagram of a liquid crystal display device of Embodiment 2 is shown in FIG. 7A. Further, a circuit diagram of a pixel portion of the liquid crystal display device of Embodiment 2 is shown in FIG. 7B. Reference numeral 501 denotes a source signal line, and reference numeral 502 denotes a gate signal line. A wiring 503 formed on the source signal line 501 is a capacitor wiring, and overlaps with the source signal line 501.

Reference numeral 504 denotes a pixel TFT, and the pixel TFT has a semiconductor layer 505. A portion of the gate signal line 502 is formed on the semiconductor layer 505 as a gate electrode. One of a source region and a drain region of the semiconductor layer 505 is connected to the source signal line 501, and the other is connected to an intermediate wiring 511 by a drain wiring 510. The capacitor wiring 503 is connected to a first interlayer insulating film (not shown in the figures) by a portion denoted by reference numeral 512, and a storage capacitor is formed by the capacitor wiring 503, the first interlayer insulating film, and the intermediate wiring 511 at the portion 512.

The drain wiring 510 is connected to a pixel electrode 509.

Note that it is possible to freely combine Embodiment 2 with Embodiment 1.

Embodiment 3

An example of forming a storage capacitor by a capacitor wiring, a gate insulating film, and a semiconductor layer, in addition to a structure in which a storage capacitor is formed by a capacitor wiring, a first interlayer insulating film, and an intermediate wiring, is shown in Embodiment 3. Note that the same reference symbols, are used for portions shown in FIGS. 3A to 6.

Figure 8:
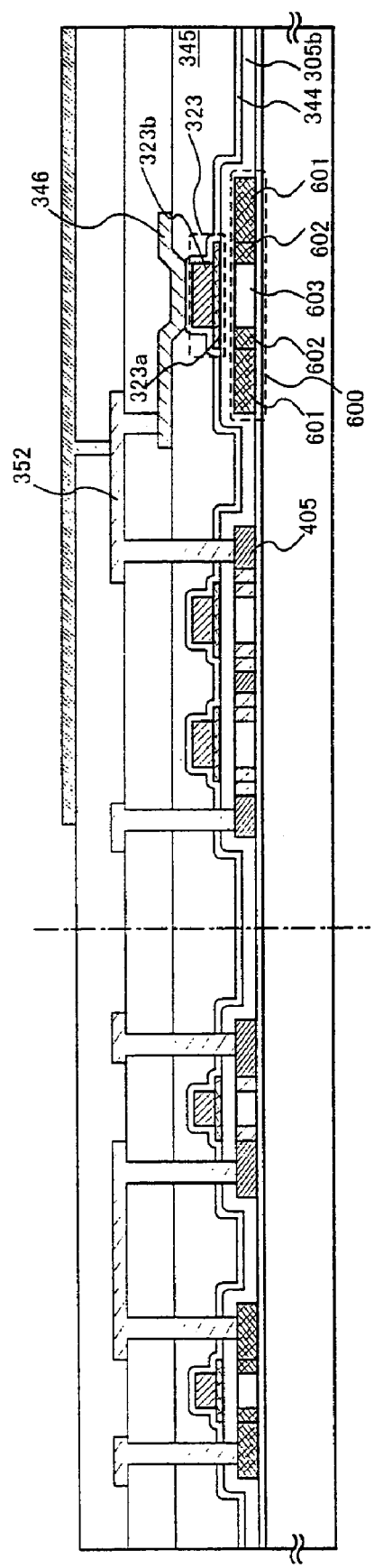
FIG. 8 is a cross sectional diagram of a liquid crystal display device of the present invention.

FIG. 8 shows a cross sectional diagram of a liquid crystal display device of Embodiment 3. The liquid crystal display device of Embodiment 3 differs from the liquid crystal display device shown in FIG. 5B in that it has a semiconductor layer 600. Other structures have already been explained in Embodiment 1. Therefore, Embodiment 1 may be referenced regarding a detailed structure of the liquid crystal display device of Embodiment 3, and the explanation thereof is omitted here.

The semiconductor layer 600 overlaps with the first capacitor wiring 323a and the second capacitor wiring 323b, sandwiching the second shape gate insulating film 305b. The semiconductor layer 600 has a channel forming region 603, a first impurity region 602 formed so as to contact an edge portion of the channel forming region 603, and a second impurity region 601 formed so as to contact the first impurity region 602. The impurity concentration in the first impurity region 602 is lower than the impurity concentration in the second impurity region 601. Further, the first impurity region 602 overlaps with the first capacitor wiring 323a, sandwiching the second shape gate insulating film 305b.

Note that a voltage such that a channel is formed in the channel forming region 603 of the semiconductor layer 600 is always applied to the capacitor wiring 323.

The intermediate wiring 346 is electrically connected to the drain region 405 of the pixel TFT 201 by the drain wiring 352. Further, the intermediate wiring 346 contacts the first interlayer insulating film 344 on the second capacitor wiring 323b through the contact hole formed in the second interlayer insulating film 345.

The capacitance value of the storage capacitor can be increased in accordance with the structure of Embodiment 3. Note that the brightness of the liquid crystal display device is reduced due to a drop in the aperture ratio if the size of the surface area of the storage capacitor is increased. However, with the structure of Embodiment 3, the storage capacitor formed by the capacitor wiring 323, the second shape gate insulating film 305b, and the semiconductor layer 600 overlaps with the storage capacitor formed by the intermediate wiring 346, the first interlayer insulating film 344, and the capacitor wiring 323, and therefore the capacitance value of the storage capacitor can be raised without lowering the aperture ratio.

Note that, although an example in which the pixel TFT is an n-channel TFT is explained in Embodiment 3, the present invention is not limited to this, and a p-channel TFT may also be used for the pixel TFT.

Note that it is possible to implement Embodiment 3 in combination with Embodiment 1 or 2.

Embodiment 4

An example of forming an electric power source supply line and a shielding film (black matrix) at the same time is explained in Embodiment 4. Note that the same reference symbols are used for portions shown in FIGS. 3A to 6.

Figure 9:
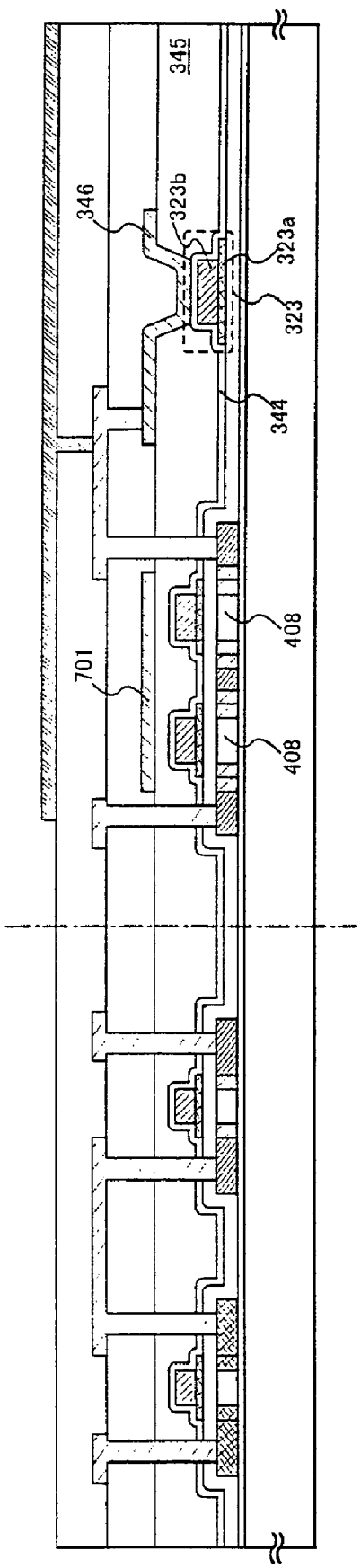
FIG. 9 is a cross sectional diagram of a liquid crystal display device of the present invention.

FIG. 9 shows a cross sectional diagram of a liquid crystal display device of Embodiment 4. The liquid crystal display device of Embodiment 4 differs from the liquid crystal display device shown in FIG. 5B in that it has a shielding film 701. Note that other structures have already been explained in Embodiment 1. Therefore, Embodiment 1 may be referenced regarding a detailed structure of the liquid crystal display device of Embodiment 4, and the explanation thereof is omitted here.

The intermediate wiring 346 contacts the first interlayer insulating film 344 on the second capacitor wiring 323b through the contact hole formed in the second interlayer insulating film 345.

The shielding film 701 is formed on the second interlayer insulating film 345 at the same time as the intermediate wiring 346. An increase in the off current due to light from the outside of the liquid crystal display device being injected to a channel forming region of the pixel TFT can be prevented by forming the shielding film 701.

Further, it is possible to form the shielding film 701 of Embodiment 4 at the same time as the intermediate wiring 346, and therefore, the number of process steps need not be increased.

Note that it is very important in Embodiment 4 that the shielding film 701 and the intermediate wiring 346 be formed by a material through which it is difficult for light to pass.

Although an example in which the pixel TFT is an n-channel TFT is explained in Embodiment 4, the present invention is not limited to this, and a p-channel TFT may also be used as the pixel TFT. Further, the shielding film is only formed on the channel forming region 408 of the pixel TFT, but the present invention is not limited to this. The shielding film may also be formed on the channel forming region of the driver circuit TFT.

Note that it is possible to implement Embodiment 4 in combination with any of Embodiments 1 to 3.

Embodiment 5

An example, which differs from that of Embodiment 1, of forming a contact hole in the first shape gate insulating film 305b, the first interlayer insulating film 344, the second interlayer insulating film 345, and the third interlayer insulating film 347 for forming the source wiring and the drain wiring is explained in Embodiment 5. Note that the reference symbols used are the same as those shown in FIGS. 3A to 6.

Figure 10:
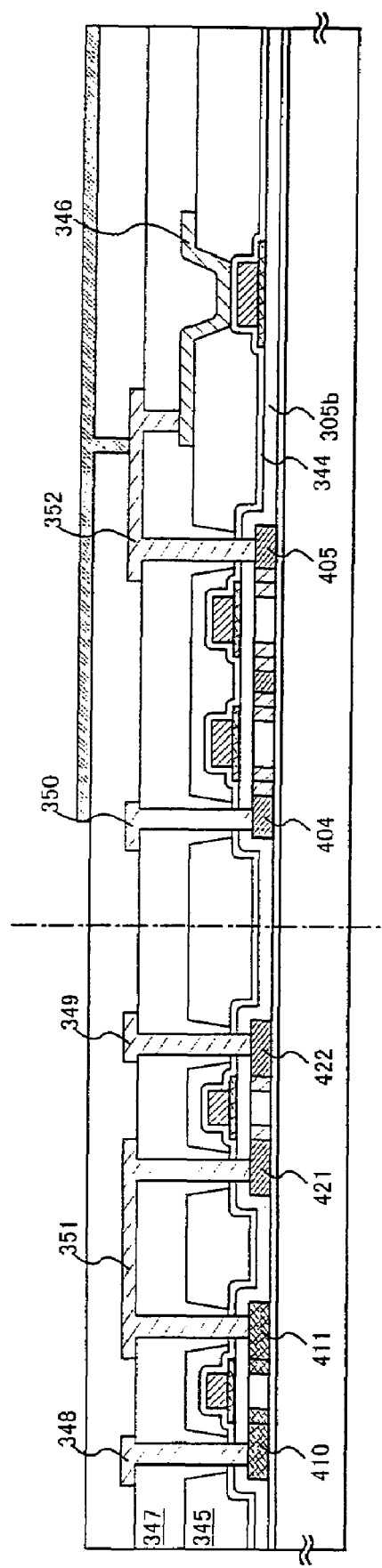
FIG. 10 is a cross sectional diagram of a liquid crystal display device of the present invention.

A cross sectional diagram of a liquid crystal display device of Embodiment 5 is shown in FIG. 10. The liquid crystal display device of Embodiment 5 differs from the liquid crystal display device shown by FIG. 5B in its contact hole structure. Note that structures other than that of the contact hole have already been stated in Embodiment 1, and therefore Embodiment 1 may be referenced regarding the detailed structure of the liquid crystal display device of Embodiment 5. The explanation thereof is omitted in Embodiment5.

At the same time as forming a contact hole in order to form the intermediate wiring 346 in the second interlayer insulating film 345, and before forming the intermediate wiring 346, a contact hole for forming the source wirings 348 to 350 and the drain wirings 351 and 352 is formed in the second interlayer insulating film 345 in Embodiment5. Contact holes are not formed in the first interlayer insulating film 344 and the second shape gate insulating film 305b at this point.

Next, after forming the intermediate wiring 346, the third interlayer insulating film 347 is formed. A contact hole is then formed in the third interlayer insulating film 347, the first interlayer insulating film 344, and the second shape gate insulating film 305b, and the source wirings 348 to 350, and the drain wirings 351 and 352 are formed so as to connect to the source regions 410, 422, and 404, the drain regions 411, 421, and 405, and the drain wiring 346.

The contact holes for connecting to the source regions 410, 422, and 404, and to the drain regions 411, 421, and 405, can be formed without etching the second interlayer insulating film 345 with the above structure in Embodiment 5, and etching is simplified.

Note that a case of an n-channel TFT as the pixel TFT is explained in Embodiment 5, but the present invention is not limited to this, and a p-channel TFT may also be used for the pixel TFT.

Note that it is possible to combine Embodiment 5 with any of Embodiments 1 to 4.

Embodiment 6

An example of forming a light shielding film between a substrate and a semiconductor layer of a TFT is explained in Embodiment 6. Note that the same reference symbols are used for portions shown in FIGS. 3A to 6.

Figure 11:
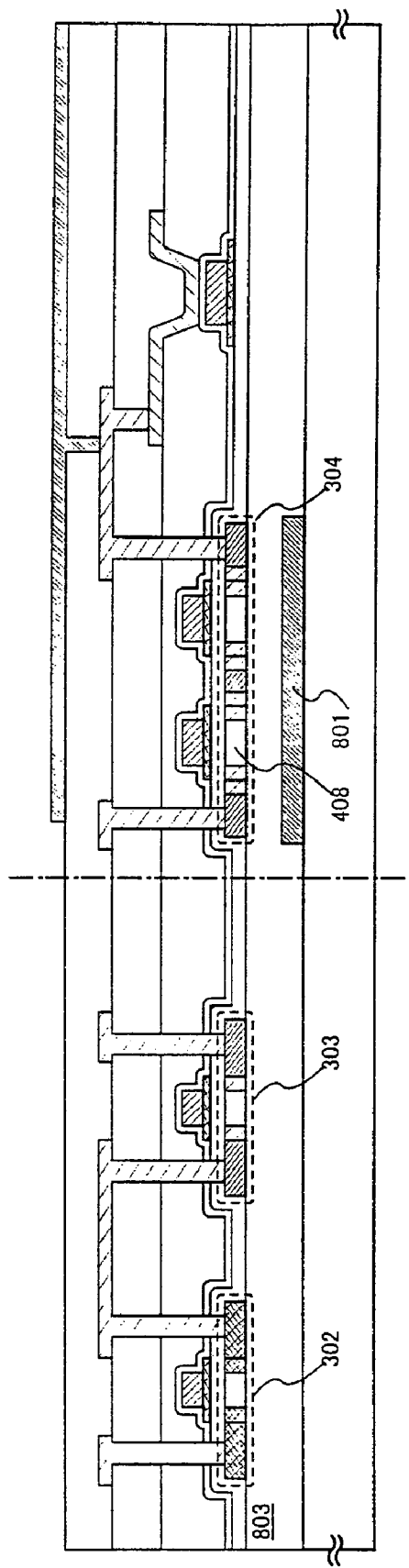
FIG. 11 is a cross sectional diagram of a liquid crystal display device of the present invention.

FIG. 11 shows a cross sectional diagram of a liquid crystal display device of Embodiment 6. The liquid crystal display device of Embodiment 6 differs from the liquid crystal display device shown in FIG. 5B in that it has a shielding film 801. Note that other structures have already been explained in Embodiment 1. Therefore, Embodiment 1 may be referenced regarding the detailed structure of the liquid crystal display device of Embodiment 6, and the explanation thereof is omitted here.

The shielding film 801 is formed below the semiconductor layer 304 of the pixel TFT in the liquid crystal display device of Embodiment 6. The shielding film 801 overlaps with the channel forming region 408 of the pixel TFT semiconductor layer 304, sandwiching an insulating film (an oxide film in Embodiment 6) 803.

The shielding film 801 can shield light, and it is possible to use any material for the shielding film 801 provided that the material can withstand the heat treatment process temperatures of steps after the formation of the shielding film. It is possible to use materials such as metals and silicon, through which light does not easily pass, and W is used in Embodiment 6. Note that it is preferable that the thickness of the shielding film 801 be on the order of 0.1 to 0.5 µm. Further, it is preferable that the thickness of the oxide film 803 be on the order of 0.5 to 1.5 µm. In addition, it is preferable that the distance between the shielding film 801 and the semiconductor layer 304 be on the order of 0.1 to 0.5 µm.

Note that, although the shielding film is only formed under the semiconductor layer 304 of the pixel TFT formed in the pixel portion in Embodiment 6, Embodiment 6 is not limited to this structure. The shielding film may also similarly be formed under the semiconductor layers 300 and 303 of the TFTs of the driver circuits.

An increase in the TFT off current due to light injected from the lower side of the substrate to the channel forming regions is prevented in accordance with the above structure in Embodiment 6.

If the oxide film 803 does not have a leveled surface, then a problem occurs in which the semiconductor layers formed on top the oxide film 803 are not uniformly crystallized during crystallization. The semiconductor layers are formed directly on the oxide film 803, and therefore it is preferable to level the surface of the oxide film 803 before forming the semiconductor layers.

For example, the oxide film 803 may be leveled by CMP (chemical mechanical polishing). CMP polishing can be performed using a known method.

Polishing using a mixture of silica gel and an electrolytic solution is performed in Embodiment 6. Polishing is performed in the electrolytic solution by applying a pressure of 100 kg/cm$^2$ to a polishing pad. The pressure during polishing can be selected from within the range of 50 to 150 kg/cm$^2$. Further, polishing is performed with a gap of 0.1 µm between the surface being polished and the polishing pad.

The TFT off current can be suppressed and non-uniformities in the crystallinity of the semiconductor layers can be prevented in accordance with the above structure.

Although an example of a case in which the pixel TFT is an n-channel TFT is explained in Embodiment 6, the present invention is not limited to this and a p-channel TFT may also be used for the pixel TFT.

Note that it is possible to implement Embodiment 6 in combination with any of Embodiment 1 to 5.

Embodiment 7

An example of forming a gate signal line after forming a source signal line is explained in Embodiment 7.

Figure 12A:
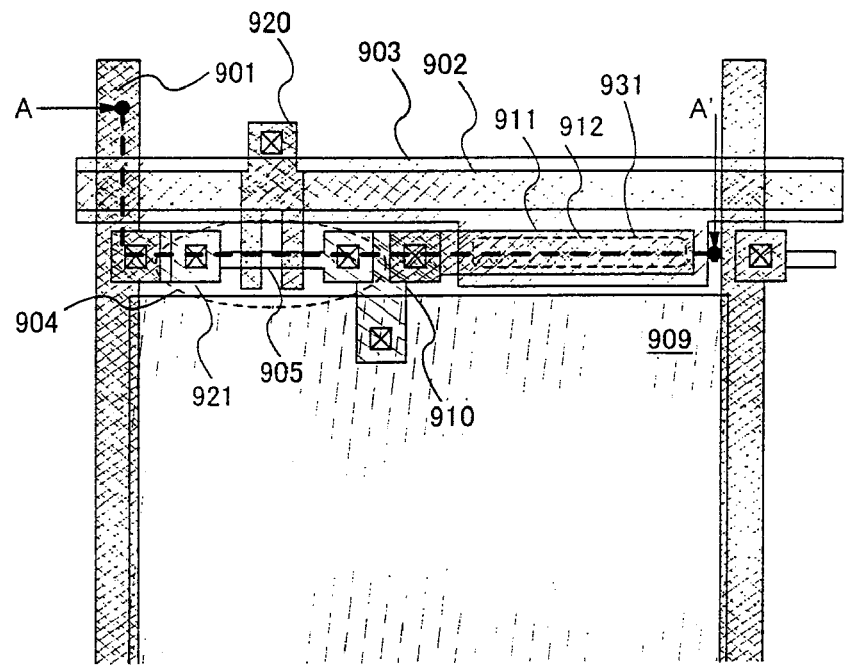
FIGS. 12A and 12B are a top surface view and a cross sectional diagram, respectively, of a pixel of a liquid crystal display device of the present invention.
Figure 12B:
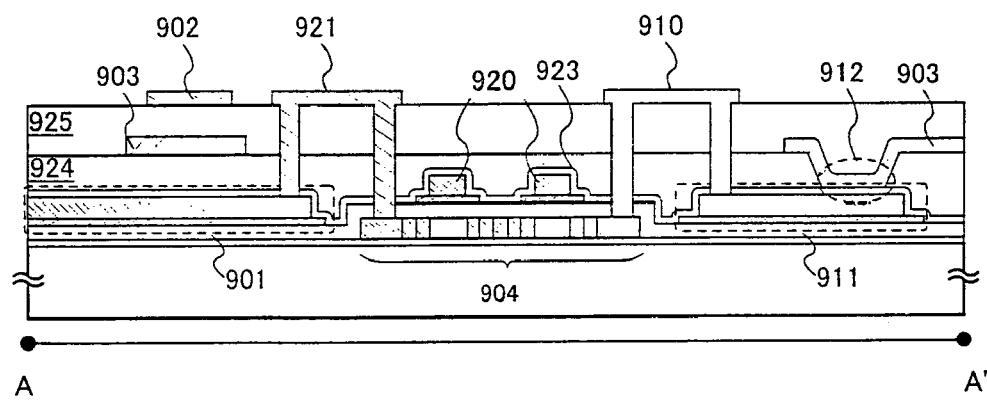

FIG. 12A shows a top surface diagram of a liquid crystal display device of Embodiment 7. Note that FIG. 12B is a cross sectional diagram of FIG. 12A cut along the line A-A'. Reference numeral 901 denotes a source signal line, and reference numeral 902 denotes a gate signal line. A wiring 903 formed under the gate signal line 902 is an intermediate wiring, and the wiring 903 overlaps with the gate signal line 902.

Reference numeral 904 denotes a pixel TFT, and the pixel TFT 904 has a semiconductor layer 905. A gate electrode 920 connected to the gate signal line 902 is formed on the semiconductor layer 905. One of a source region and a drain region of the semiconductor layer 905 is connected to the source signal line 901 by a source wiring 921, and the other is connected to a capacitor wiring 911 by a drain wiring 910. The intermediate wiring 903 is connected to a first interlayer insulating film 923 by a portion denoted by reference numeral 912, and a storage capacitor 912 is formed by the intermediate wiring 903, the first interlayer insulating film 923, and the capacitor wiring 911.

The drain wiring 910 is connected to a pixel electrode 909.

The intermediate wiring 903 is formed between a second interlayer insulating film 924 and a third interlayer insulating film 925 with the present invention. The electric power source supply line can thus be formed overlapping with the gate signal line 902, and the aperture ratio can therefore be increased.

Embodiment 8

An example of forming a crystalline semiconductor film used as a semiconductor layer in the present invention by a thermal crystallization method using a catalytic element is explained in Embodiment 8, it is preferable to use the techniques disclosed in Japanese Patent Application Laid-open No. Hei 7-130652 and Japanese Patent Application Laid-open No. Hei 8-78329 when using a catalytic element.

Figure 13A:
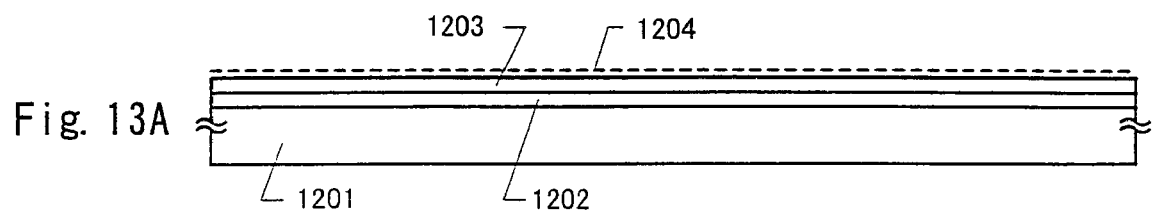
FIGS. 13A and 13B are diagrams showing a method of crystallizing a semiconductor layer.
Figure 13B:
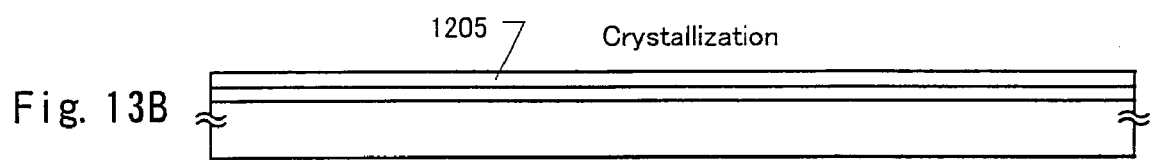

An example of applying the technique disclosed in Japanese Patent Application Laid-open No. Hei 7-130652 to the present invention is shown in FIGS. 13A and 13B. A silicon oxide film 1202 is first formed on a substrate 1201, and an amorphous silicon film 1203 is formed on the silicon oxide film 1202. In addition, a nickel acetate solution containing 10 ppm of nickel by weight is applied, forming a nickel containing layer 1204. (See FIG. 13A.)

Next, after a dehydrogenation process is performed for one hour, heat treatment at a temperature of 500 to 650° C. is performed for 4 to 12 hours, for example for 8 hours at 550° C., forming a crystalline silicon film 1205. The crystalline silicon film 1205 thus obtained has extremely superior crystallinity. (See FIG. 13B.)

Figure 14A:
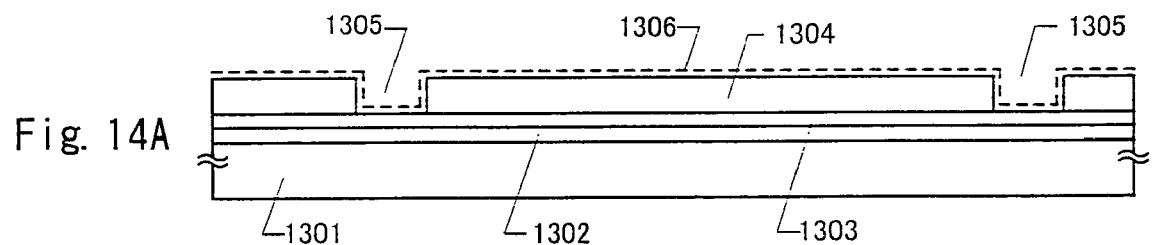
FIGS. 14A and 14B are diagrams showing a method of crystallizing a semiconductor layer.
Figure 14B:
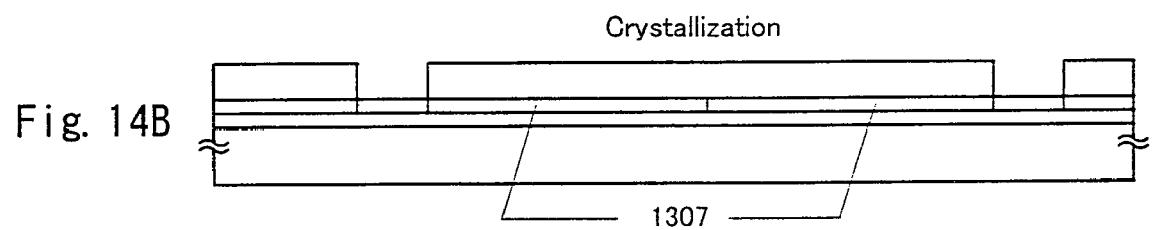

Further, the technique disclosed in Japanese Patent Application Laid-open No. Hei 8-78329 is one in which it is possible to selectively crystallize the amorphous semiconductor film in accordance with the selective addition of the catalytic element. A case of applying this technique to the present invention is explained by FIGS. 14A and 14B.

A silicon oxide film 1302 is first formed on a glass substrate 1301, and an amorphous silicon film 1303 and a silicon oxide film 1304 are formed on the silicon oxide film 1302 in succession. The thickness of the silicon oxide film 1304 is set to 150 nm at this point.

The silicon oxide film 1304 is patterned next, and opening portions 1305 are selectively formed. A nickel acetate solution containing 10 ppm of nickel by weight is then applied. A nickel containing layer 1306 is thus formed, and the nickel containing layer 1306 contacts the amorphous silicon film 1302 only on bottom portions of the opening portions 1305. (See FIG. 14A.)

Heat treatment is performed next at 500 to 650° C. for between 4 and 24 hours, for example for 14 hours at 570° C. and a crystalline silicon film 1307 is formed. Portions of the amorphous silicon film contacting the nickel are crystallized first with this crystallization process, and crystallization then proceeds in a horizontal direction. The crystalline silicon film 1307 thus formed is a collection of rod shape or needle shape crystals, and each of the crystals is grown having a specific directionality when viewed macroscopically. This crystallization process therefore has the advantage of aligned crystallinity. (See FIG. 14B.)

Note that the following elements may also be used, in addition to nickel (Ni), as catalytic elements capable of being utilized in the above two crystallization techniques: germanium (Ge), iron (Fe), palladium (Pd), tin (Sn), lead (Pb), cobalt (Co), platinum (Pt), copper (Cu), and gold (Au).

Semiconductor layers of crystalline TFTs can be formed provided that patterning of the crystalline semiconductor film (including films such as a crystalline silicon film and a crystalline silicon germanium film) formed using the above technique is performed. Superior characteristics are obtained with TFTs manufactured from a crystalline semiconductor film formed using the techniques of Embodiment 8, and therefore high reliability is demanded. However, by employing the TFT structure of the present invention, it becomes possible to manufacture TFTs utilizing the techniques of Embodiment 8 to the maximum.

Figure 15A:
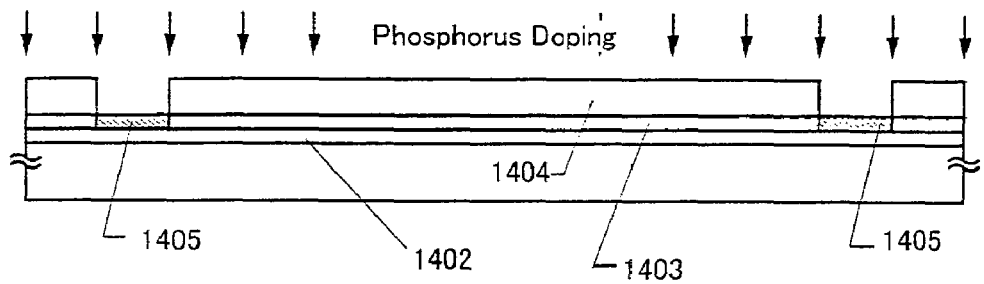
FIGS. 15A and 15B are diagrams showing a method of crystallizing a semiconductor layer.
Figure 15B:
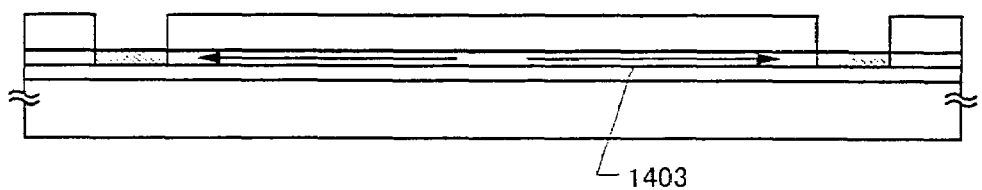

Next, an example of performing a process of removing the catalytic element from the crystalline semiconductor film after forming the crystalline semiconductor film from the amorphous semiconductor film as an initial film using the catalytic element, as the method of forming the semiconductor layer used in Embodiment 1, is explained with reference to FIGS. 15A and 15B. The technique recorded in Japanese Patent Application Laid-open No. Hei 10-135468 or the technique recorded in Japanese Patent Application Laid-open No. Hei 10-135469 is used as such a method in Embodiment 8.

The techniques recorded in the above Japanese Patent Applications are ones of removing a catalytic element used in crystallizing an amorphous semiconductor film by utilizing the gettering action of phosphorous after crystallization. The concentration of the catalytic element within the crystalline semiconductor film can be reduced to $1 \times 10^{17}$ atoms/cm$^3$ or less, preferably to $1 \times 10^{16}$ atoms/cm$^3$, by using the techniques.

A non-alkaline glass substrate, typically a Corning Corp. #1737 substrate, is used here. A state in which a base film 1402 and a crystalline silicon film 1403 are formed using the crystallization technique shown in Embodiment 4 is shown in FIG. 15A. A silicon oxide film 1404 for use as a mask is then formed with a thickness of 150 nm on the surface of the crystalline silicon film 1403, and opening portions are formed in accordance with patterning, forming regions in which the crystalline silicon film is exposed. A process of adding phosphorous is then performed, forming phosphorous added regions 1405 in the crystalline silicon film.

If heat treatment is performed in this state at 550 to 800° C. in a nitrogen atmosphere for between 5 and 24 hours, for example at 600° C. for 12 hours, then the phosphorous added regions 1405 in the crystalline silicon film work as gettering sites and the catalytic element remaining in the crystalline silicon film 1403 can be segregated into the phosphorous added regions 1405.

A crystalline silicon film in which the concentration of the catalytic element used in the crystallization process is reduced to $1 \times 10^{17}$ atoms/cm$^3$ or less can be obtained by removing the masking silicon oxide film 1404 and the phosphorous added regions 1405 by etching. The crystalline silicon film can be used as is as semiconductor layers of TFTs of the present invention.

Embodiment 9

Figure 16:
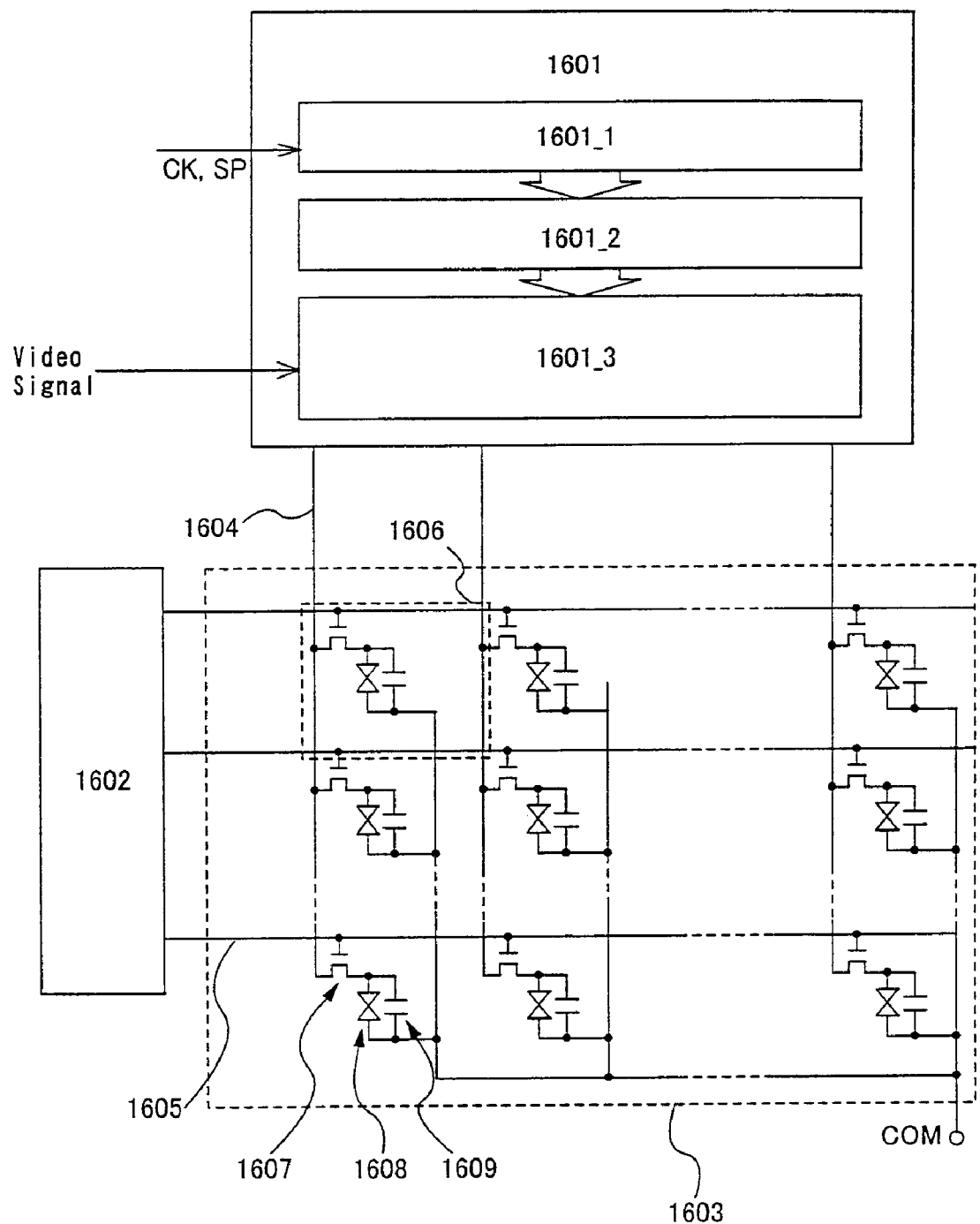
FIG. 16 is a block diagram of a liquid crystal display device of the present invention.

A method of driving a liquid crystal display device of the present invention is explained. A block diagram of an example of the liquid crystal display device of the present invention is shown in FIG. 16.

Reference numeral 1601 denotes a source signal line driver circuit, reference numeral 1602 denotes a gate signal line driver circuit, and reference numeral 1603 denotes a pixel portion. One each of the source signal line driver circuit and the gate signal line driver circuit are formed in Embodiment 9, but the present invention is not limited to this structure. Two source signal line driver circuits may also be formed, and two gate signal line driver circuits may also be formed.

The source signal line driver circuit 1601 has a shift register circuit 1601$_{13}$1, a level shift circuit 1601$_{13}$2, and a sampling circuit 1601$_{13}$3. Note that the level shift circuit 1601$_{13}$2 may be used when necessary, and need not be used. Further, the level shift 1601$_{13}$2 is formed between the shift register 1601$_{13}$1 and the sampling circuit 1601$_{13}$3 in Embodiment 9, but the present invention is not limited to this structure. A structure in which the level shift circuit 1601$_{13}$2 is contained within the shift register 1601$_{13}$1 may also be used.

A clock signal CL and a start pulse signal SP are input to the shift register circuit 1601$_{13}$1. A sampling signal in order to sample the video signals is output from the shift register circuit 1601$_{13}$1. The output sampling signal is input to the level shift circuit 1601$_{13}$2, its electric potential amplitude is increased, and it is output.

The sampling signal output from the level shift 1601$_{13}$2 is input to the sampling circuit 1601$_{13}$3. The video signals are input to the sampling circuit 1601$_{13}$3 at the same time through a video signal line (not shown).

The input video signals are sampled in the sampling circuit 1601$_{13}$3 in accordance with the sampling signals, and the result is input to predetermined pixels through source signal lines 1604.

The source signal lines 1604 connected to the source signal line driver circuit 1601, and gate signal lines 1605 connected to the gate signal line driver circuit 1602 intersect in the pixel portion 1603. A thin film transistor (pixel TFT) 1607 of a pixel 1606, a liquid crystal cell 1608 in which a liquid crystal is sandwiched between an opposing electrode and the pixel electrode, and a storage capacitor 1609 are formed in regions surrounded by the source signal lines 1604 and by the gate signal lines 1605.

The pixel TFTs 1607 operate in accordance with a selection signal input from the gate signal line driver circuit 1602 through the gate signal lines 1605. A video signal which has been sampled is input to the source signal lines 1604 is selected by the pixel TFT 1607 and at the same time written into predetermined pixel electrode.

Note that, although the source signal line driver circuit 1601 and the gate signal line driver circuit 1602 are formed on the substrate on which the pixel portion 1603 is formed in Embodiment 9, the present invention is not limited by this. The source signal line driver circuit 1601 and the gate signal line driver circuit 1602 may also be formed on an IC chip, and connected to the pixel portion 1603 through an FPC or a TAB.

Further, the method of driving the liquid crystal display device of the present invention is not limited by the driving method shown in Embodiment 9.

It is possible to freely combine Embodiment 9 with any of Embodiments 1 to 8.

Embodiment 10

The first etching process for forming the first shape conductive layers is performed with one set of etching conditions in Embodiment 1, but may also be performed under a plural set of etching conditions in order to increase the uniformity in the film reduction and in the shape of the gate insulating film. An example of forming a first shape conductive layer by performing the first etching process under two sets of etching conditions is shown in Embodiment 10.

Further, both sides of the conductive layer are formed so as to have a taper, and LDD regions are formed in both sides of the channel forming region, with the present invention. However, Embodiment 10 is explained in accordance with a process of manufacturing using blow-up diagrams of one side of the vicinity of a conductive layer in an n-channel TFT of a driver circuit in FIGS. 18A to 18D. Note that, for simplicity, a base film and a substrate are not shown in the figures.

First, the same state as that of FIG. 3B is obtained in accordance with Embodiment 1. However, although Ta is used as the first conductive film in Embodiment 1, TaN, which has extremely high heat resistance, is used in Embodiment 10 as the first conductive film. The first conductive film is formed having, a film thickness of 20 to 100 nm, and the second conductive film may be formed with a film thickness of 100 to 400 nm. A first conductive film made from TaN with a film thickness of 30 nm, and a second conductive film made from W having a film thickness of 370 nm are laminated in Embodiment 10.

A first shape mask 1505a is formed next from resist, etching is performed by ICP, and a first shape second conductive layer 1504a is formed. A mixed gas of $CF_4$, $Cl_2$, and $O_2$ is used as an etching gas having high selectivity with respect to TaN here, and therefore the state shown in FIG. 18A can be obtained. Several etching conditions, and their relationship to the etching rate of the second conductive layer (W), the etching rate of the first conductive layer (TaN), and the taper angle of the second conductive layer (W) are shown in Table 1.

TABLE 1

ETCHING RATE (E.R.) OF W AND TaN AND W TAPER ANGLE

| CONDITION | ICP [W] | BIAS [W] | PRESSURE [Pa] | $CF_4$ | $Cl_2$ | $O_2$ | W E.R. (1) [nm/min] | TaN E.R. (2) [nm/min] | SELECTIVITY OF W/TaN (1)/(2) | W TAPER ANGLE [deg] |
|---|---|---|---|---|---|---|---|---|---|---|
| | | | | [sccm] | | | | | | |
| 1 | 500 | 20 | 1.0 | 30 | 30 | 0 | 58.97 | 66.43 | 0.899 | 80 |
| 2 | 500 | 60 | 1.0 | 30 | 30 | 0 | 88.71 | 118.46 | 0.750 | 25 |
| 3 | 500 | 100 | 1.0 | 30 | 30 | 0 | 111.66 | 168.03 | 0.667 | 18 |
| 4 | 500 | 20 | 1.0 | 25 | 25 | 10 | 124.62 | 20.67 | 6.049 | 70 |
| 5 | 500 | 60 | 1.0 | 25 | 25 | 10 | 161.72 | 35.81 | 4.528 | 35 |
| 6 | 500 | 100 | 1.0 | 25 | 25 | 10 | 176.90 | 56.32 | 3.008 | 32 |
| 7 | 500 | 150 | 1.0 | 25 | 25 | 10 | 200.39 | 80.32 | 2.495 | 26 |
| 8 | 500 | 200 | 1.0 | 25 | 25 | 10 | 218.20 | 102.87 | 2.124 | 22 |
| 9 | 500 | 250 | 1.0 | 25 | 25 | 10 | 232.12 | 124.97 | 1.860 | 19 |
| 10 | 500 | 20 | 1.0 | 20 | 20 | 20 | — | 14.83 | — | — |
| 11 | 500 | 60 | 1.0 | 20 | 20 | 20 | 193.02 | 14.23 | 13.695 | 37 |
| 12 | 500 | 100 | 1.0 | 20 | 20 | 20 | 235.27 | 21.81 | 10.856 | 29 |
| 13 | 500 | 150 | 1.0 | 20 | 20 | 20 | 276.74 | 38.61 | 7.219 | 26 |
| 14 | 500 | 200 | 1.0 | 20 | 20 | 20 | 290.10 | 45.30 | 6.422 | 24 |
| 15 | 500 | 250 | 1.0 | 20 | 20 | 20 | 304.34 | 50.25 | 6.091 | 22 |

*) "—" in cell indicates that the measurement was not possible because the W surface was deteriorated at the etching.

Figure 18A:
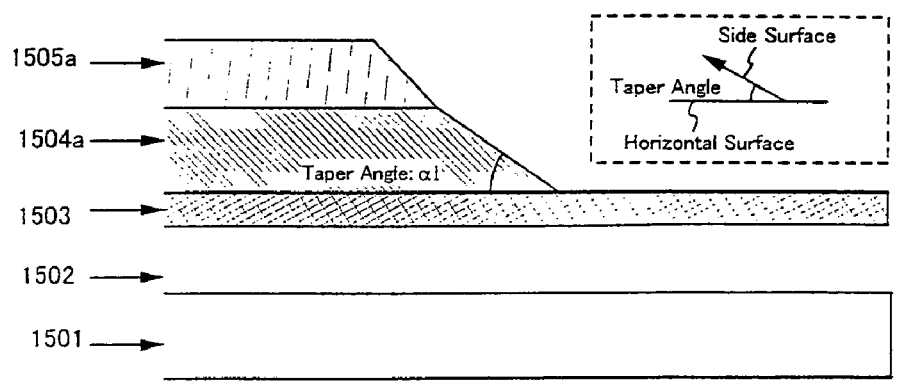
FIGS. 18A to 18D are diagrams showing a process of manufacturing a liquid crystal display device of the present invention.

Note that a taper angle indicates the angle formed between a horizontal plane and a side face of a material layer in this specification, as shown in the upper right diagram of FIG. 18A. Further, for convenience, the side face having a taper angle is referred to as a taper, and a portion having the taper is referred to as a tapered portion throughout this specification.

Further, the angle formed between a horizontal plane and the side face of the second conductive layer (W) (a taper angle α1) can be freely set with a range of 19 to 70° by using one of the conditions 4 to 15 within Table 1, for example, as the first etching conditions. Note that the etching time may be suitably set by the operator.

Further, in FIG. 18A. reference numeral 1501 denotes a semiconductor layer, reference numeral 1502 denotes a gate insulating film, and reference numeral 1503 denotes a first conductive film.

Etching is performed next with the second etching conditions with the mask 1505a left in place as is, forming a first shape first conductive layer 1503a. Note that the gate insulating film 1502 is also somewhat etched when performing etching under the second etching conditions, becoming a first shape gate insulating film 1502a. A mixed gas made from $CF_4$, and $Cl_2$ is used here as the etching gas under the second etching conditions. Any of the conditions 1 to 3 of Table 1, for example, may be used as the second etching conditions. Film reduction of the gate insulating film 1502 can thus be suppressed by performing the first etching process with two sets of etching conditions. (See FIG. 18B.)

Figure 18B:
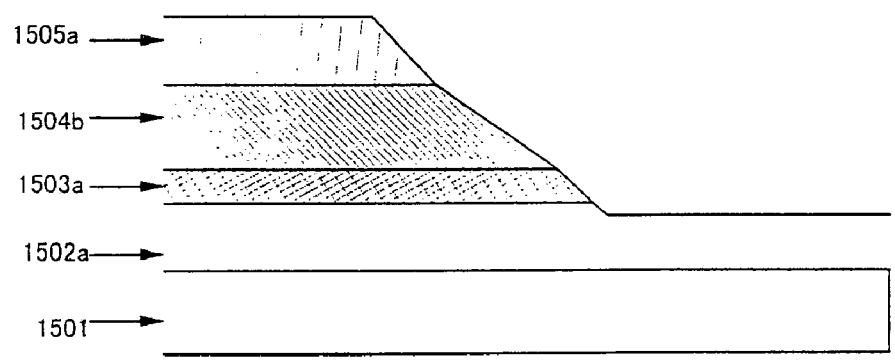

Note that the first shape second conductive layer 1504a in FIG. 18B is also etched somewhat when performing etching under the second etching conditions. However, the amount is microscopic (approximately 0.15 μm, namely 0.3 μm of the overall line width), and therefore it is shown in the figure having the same shape as in FIG. 18A.

Figure 18C:
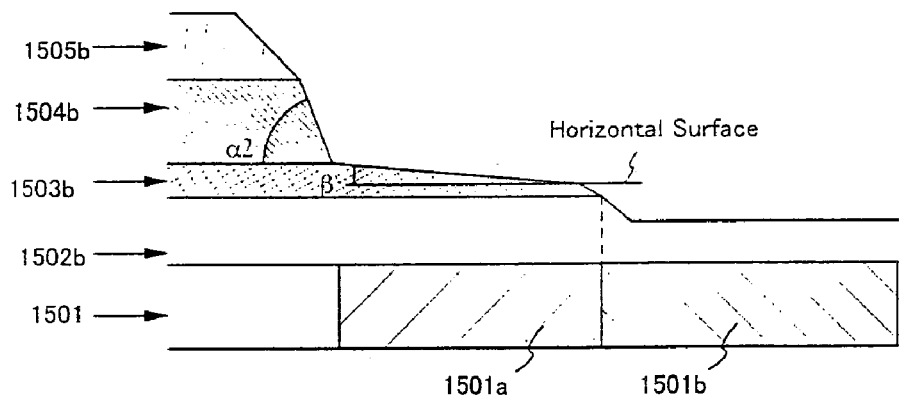
Figure 18D:
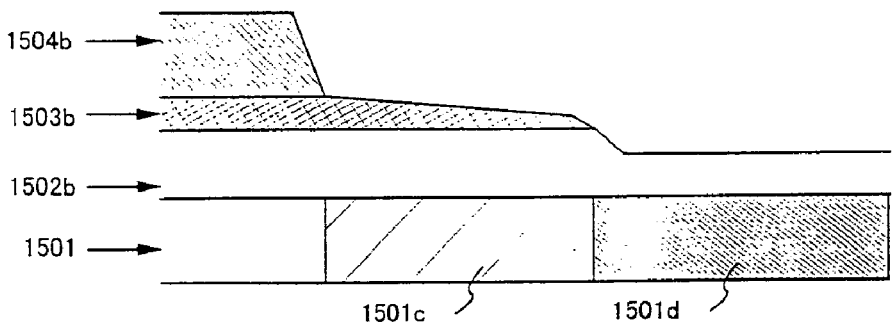

A second etching, process is performed next with the mask 1505a left in place as is, and a second shape conductive layer shown in FIG. 18C is obtained. Etching is performed under etching conditions using a mixed gas made from $CF_4$, $Cl_2$, and $O_2$ as the second etching process inn Embodiment 10. Any of the conditions 4 to 15 of Table 1 may be used for the etching conditions here, and the etching time may be suitably determined. Further, the width of each conductive layer in the channel longitudinal direction can be freely set in accordance with the etching conditions. A second shape mask 1505b, a second shape first conductive layer 1503b, a second shape second conductive layer 1504b, and a second shape gate insulating film 1502b are formed by the second etching process.

Note that the second shape first conductive layer 1503b corresponds to the first gate electrode, and that the second shape second conductive layer 1504b corresponds to the second gate electrode in Embodiment 10.

A taper angle α2, which is larger than the taper angle α1, is formed in the second shape second conductive layer 1504b, and an extremely small taper angle β is formed in the second shape first conductive layer 1503b.

A first doping process is performed next with the mask 1505b left in place as is. (See FIG. 18C.) N-type conductivity imparting phosphorous is added to the semiconductor layer 1501 here using ion doping with the second shape second conductive layer 1504b as a mask. Further, the first doping process is performed in a state in which the mask 1505b remains as is here, but the first doping process may also be performed after removing the mask 1505b.

Impurity regions 1501a and 1501b are formed in accordance with the first, doping process. Further, the semiconductor layer overlapping the second conductive layer, sandwiching the gate insulating film and the first conductive layer, becomes a channel forming region. Note that, although not shown in the figures, the impurity regions 1501a and 1501b are formed on both sides of the channel forming region, and have linear symmetry.

Further, the ion penetration depth in doping becomes shallower the thicker the film thickness of the material layer arranged over the semiconductor layer becomes. Therefore, the impurity region 1501a which overlaps with the first conductive layer, sandwiching the gate insulating film, namely the first LDD region (Lov region) is influenced by the tapered portion having the side face with the taper angle β, and the concentration of the impurity element added within the semiconductor layer changes. The impurity element concentration decreases the thicker the film thickness, and the impurity element concentration increases the thinner the film thickness.

Further, there are also cases in which a tapered portion is formed in the gate insulating film in accordance with the etching conditions when performing the second etching process, The semiconductor layer is also influenced by this tapered portion in such cases, and the concentration of the impurity element added within the semiconductor layer changes.

On the other hand, the film thickness of the gate insulating film is nearly constant in the impurity region 1501b which does not overlap with the first conductive layer, namely the second LDD region (Loff region), and therefore the impurity concentration is nearly constant.

Although not shown in the figures, a resist mask is formed next, covering a portion of the pixel TFT. The length of the Loff region in the pixel TFT is determined by controlling the size of the resist mask.

A second doping process is performed next. An impurity element which imparts a single conductivity type to a semiconductor, n-type conductivity imparting phosphorous here, is added to the semiconductor layer 1501 using ion doping with the second shape first conductive layer 1503b and the second shape second conductive layer 1504b as masks. The second doping process performs doping of a higher concentration than in the first doping process, and impurity regions 1501c and 1501d are formed.

In addition to the impurity concentration added by the first doping process, the impurity region 1501d, namely a source region or a drain region, becomes to have even more high concentration in accordance with the second doping process.

Further, the impurity region 1501c is not doped because it overlaps with the first conductive layer, and it has the identical concentration distribution as the impurity region 1501a. The impurity region 1501c is therefore also a first LDD region. However, the impurity region 1501c becomes to have higher concentration depending upon the doping conditions. In that case, it is influenced by the tapered portion having a side face with a taper angle β in the second doping process, similar to the first doping process, and the impurity is added within the semiconductor layer.

On the other hand, only portions of the pixel TFT not covered by the resist mask are doped, forming source regions or drain regions. Further, the second LDD region 1501b, which is covered by the resist mask and does not overlap with the conductive layer, remains as is.

The resist mask of the pixel TFT is removed next.

The active matrix substrate of FIG. 6B may be manufactured by performing subsequent processing in accordance with the processes of Embodiment 1 from FIG. 4C onward.

The driver circuit n-channel TFT and the pixel TFT are thus separately made in accordance with the above method.

The driver circuit n-channel TFT is provided with: a channel forming region overlapping with a second conductive layer, sandwiching a gate insulating film; first LDD regions on both sides of the channel forming region; and source regions or drain regions contacting the first LDD regions. The pixel TFT is provided with: a channel forming region overlapping with a second conductive layer, sandwiching a gate insulating film; first LDD regions on both sides of the channel forming region; second LDD regions contacting the first LDD regions; and source regions or drain regions contacting the second LDD regions.

Further, the first LDD regions overlapping with the first conductive layer, sandwiching the gate insulating film, have an impurity element concentration distribution in which the concentration increases as the distance from the channel forming region increases. Note that the impurity concentration in the first LDD region contains a region having a concentration gradient in a range of at least $1\times10^{17}$ to $1\times10^{18}$ atoms/cm$^3$. Provided that the LDD region has this type of continuous concentration distribution, it is effective in lowering the off current. Further, reliability increases the longer the length in the channel longitudinal direction in the first LDD region becomes.

In practice, the boron included in regions 149 to 152 with a boron doping process (see FIG. 4C) into the driver circuit p-channel TFT also is influenced by the thickness of the first conductive layer in which a taper is positioned on the semiconductor layer, similar to the first doping process, and the concentration of the impurity element added within the impurity region changes. The impurity concentration is reduced the thicker the film thickness, and the impurity concentration increases the thinner the film thickness becomes.

Note that it is possible to freely combine Embodiment 10 with any of Embodiments 1 to 9.

Furthermore, the selectivity with the gate insulating film 1502 is extremely high when the etching gas of Embodiment 10 (gas mixture of CF$_4$ and Cl$_2$) is substituted by a gas mixture of SF$_6$ and Cl$_2$, or when the gas mixture of CF$_4$, Cl$_2$, and O$_2$ is substituted by a gas mixture of SF$_6$, Cl$_2$, and O$_2$, and therefore the film reduction can be further suppressed.

Embodiment 11

A second shape first gate electrode (TaN) becomes various shapes in accordance with etching conditions such as those recorded in Embodiment 10. A simulation and a comparison are performed in Embodiment 11 on a shape A of FIG. 19A and a shape B of FIG. 19B.

Figure 19A:
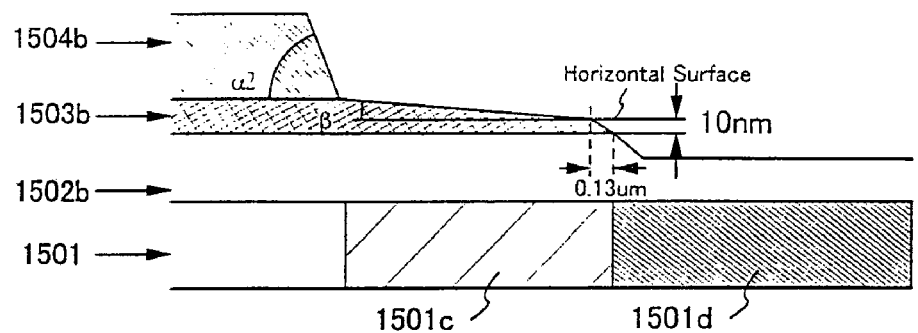
FIGS. 19A and 19B are blow-up diagrams of TFT gate electrodes.
Figure 20:
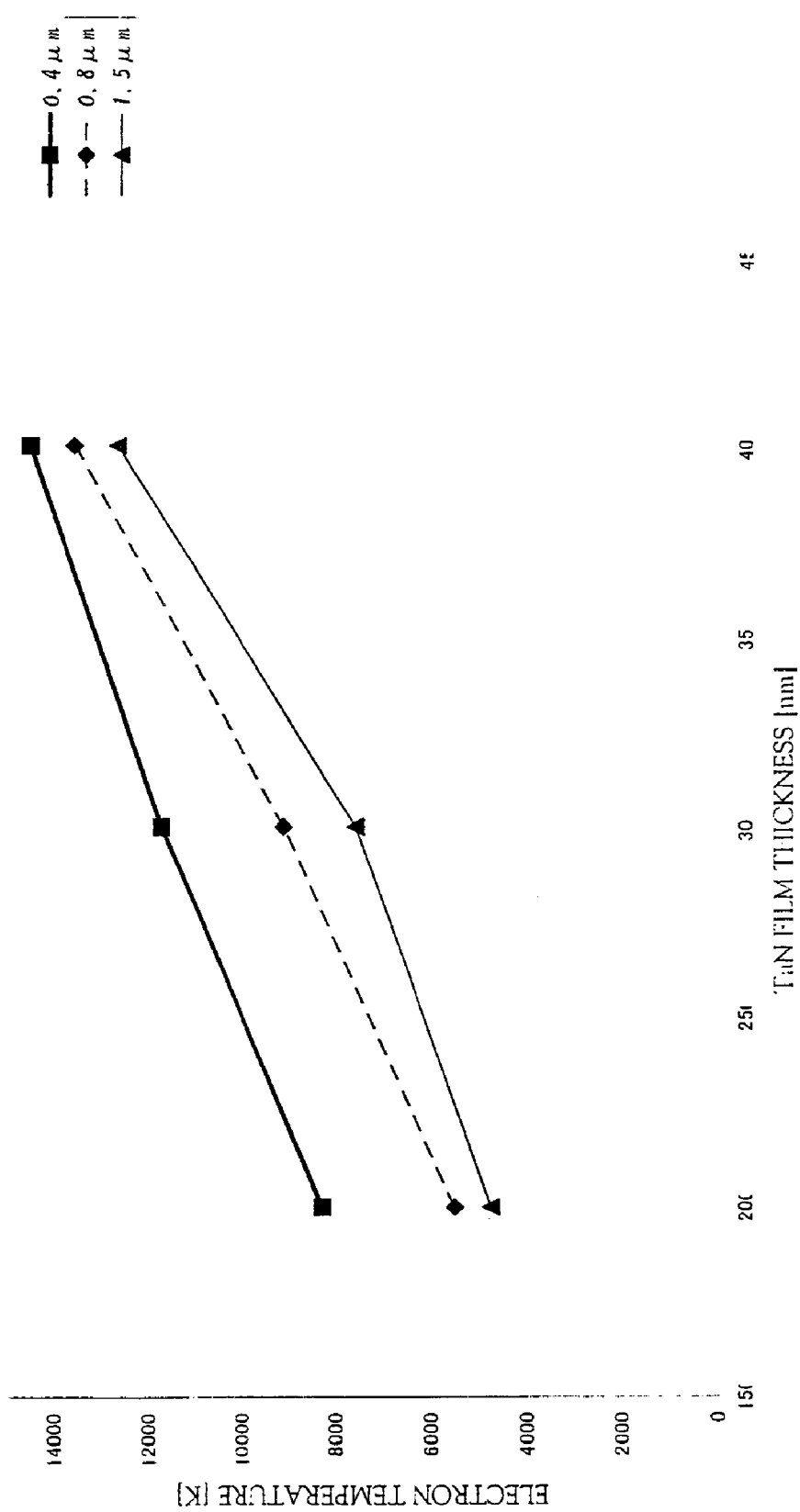
FIG. 20 is a graph showing the relationship between TaN film thickness and electron temperature in a shape A.
Figure 23:
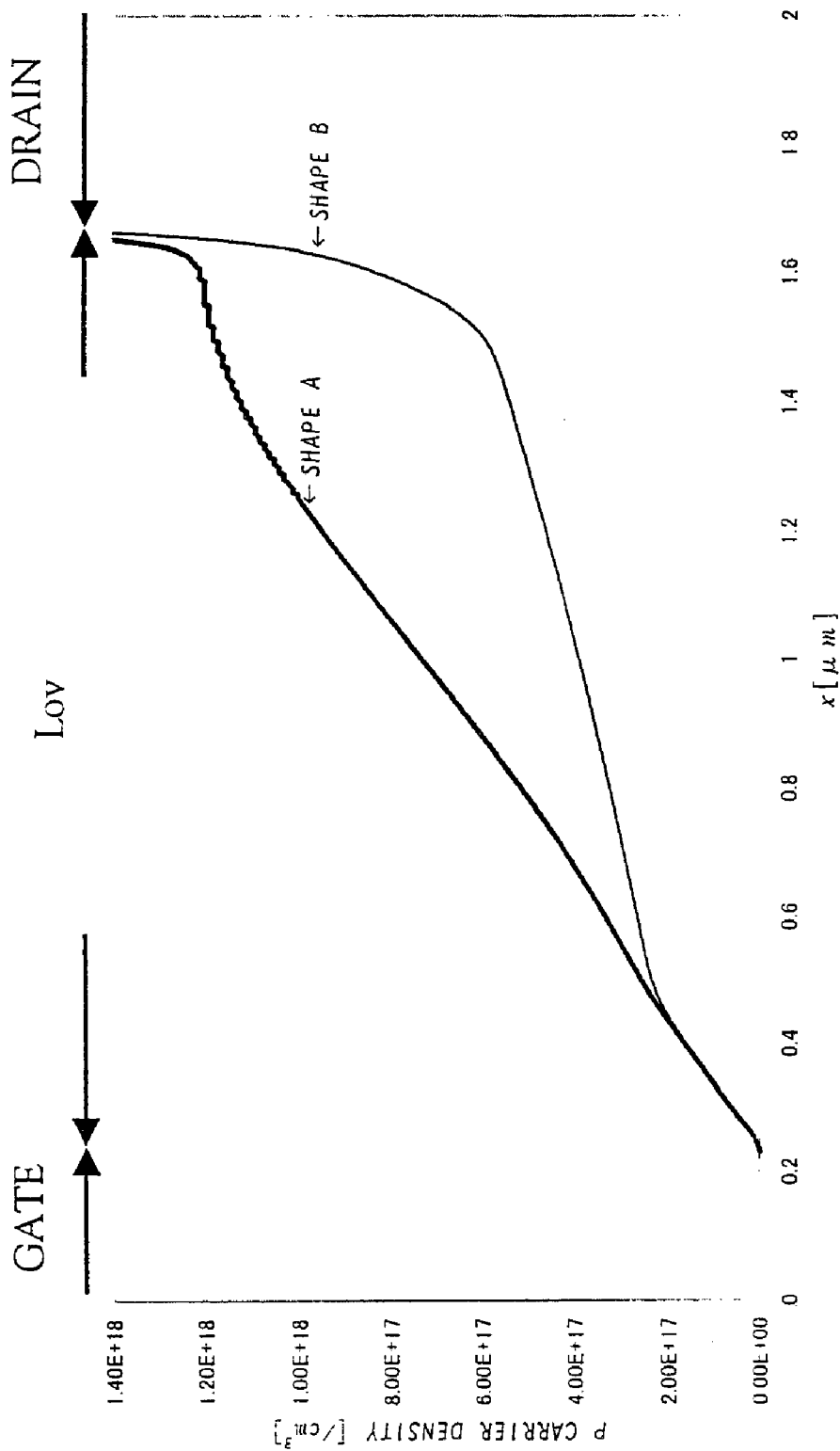
FIG. 23 is a diagram showing phosphorous concentration distributions in the shape A and the shape B.

The shape A shown in Embodiment 10 is shown in FIG. 19A. FIG. 19A is identical to FIG. 18D, and therefore the same reference symbols are used. FIG. 20 is a graph showing the relationship with electron temperature for cases of setting the length of Lov (the length of the Lov region in the channel longitudinal direction) to 0.4 μm, 0.8 μm, and 1.5 μm with a film thickness of the first gate electrode (TaN) set from 15 to 40 nm in FIG. 19A. Note that the simulation was performed using the impurity element concentration distribution in the channel longitudinal direction (the concentration distribution at a depth of 10 nm from the surface of the semiconductor layer) shown in FIG. 23. However, the simulation was performed with the taper angle changed in a portion of the first gate electrode side face, and the locations of the changes are at 10 nm of film thickness from the gate insulating film as seen in cross section, and at positions separated by 0.13 μm from the first gate electrode edge portion when seen from the top surface.

Figure 19B:
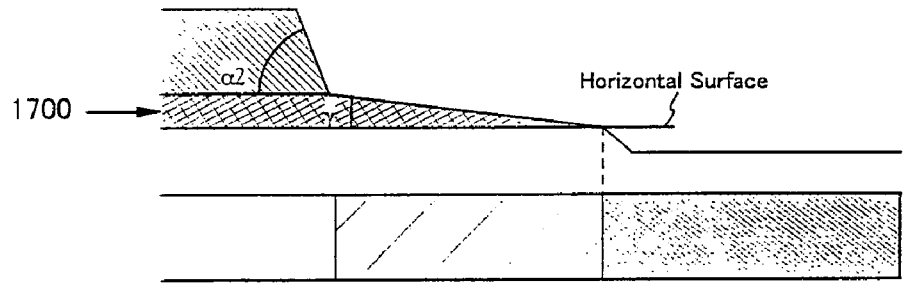

Further, FIG. 19B shows the shape B of Embodiment 11. FIG. 19B differs from FIG. 19A, and there are no locations in which the taper angle changes in a portion of the side face. A taper angle γ is formed.

Figure 21:
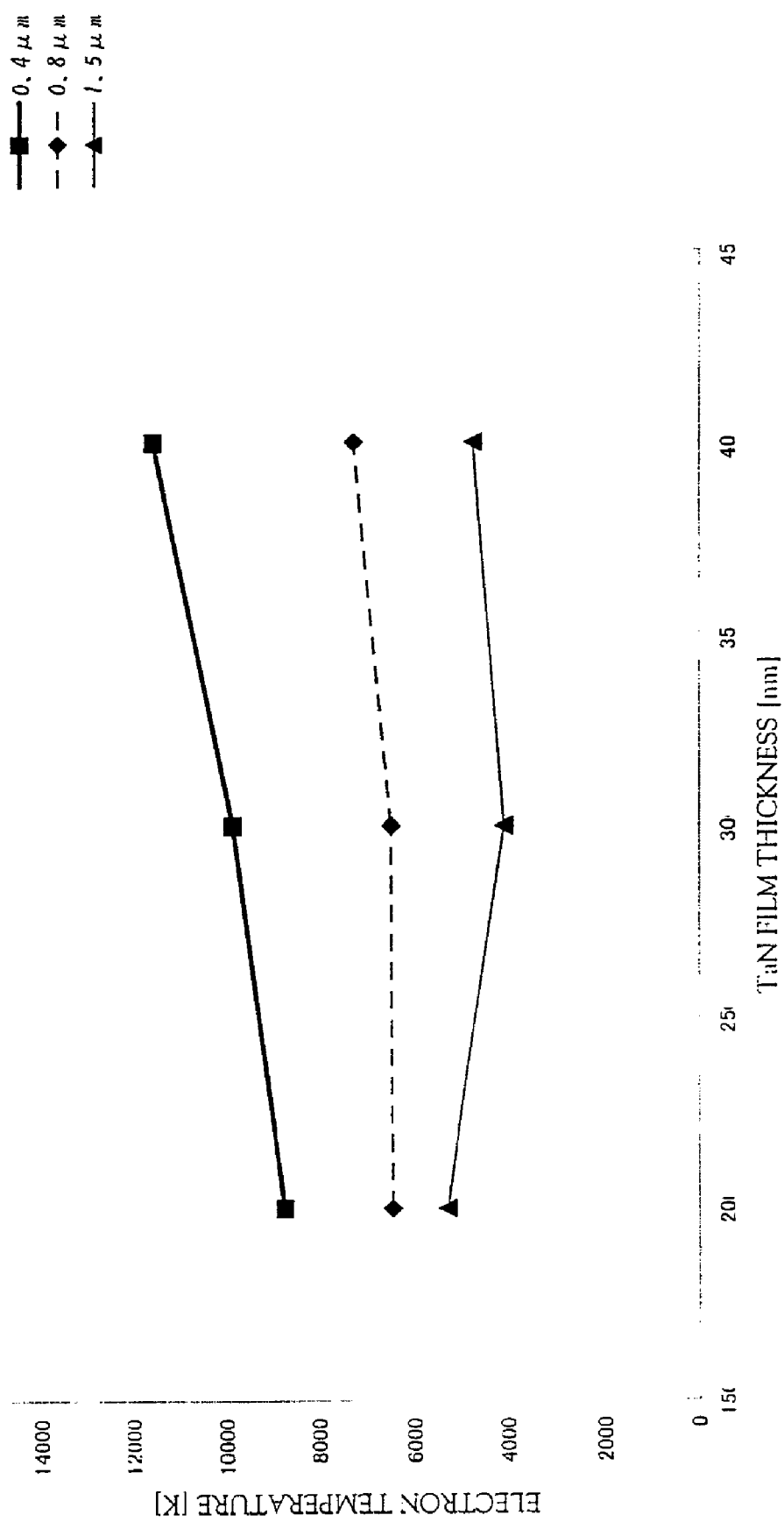
FIG. 21 is a graph showing the relationship between TaN film thickness and electron temperature in a shape B.

The simulation is similarly performed in a first gate electrode 1700 shown in FIG. 19B, and the relationship between the electron temperature for cases in which the Lov length is 0.4 μm, 0.8 μm, and 1.5 μm, with the film thickness of the first gate electrode (TaN) set from 15 to 40 nm. is shown in FIG. 21. Note that the simulation is performed using the concentration distribution of the impurity element in the channel longitudinal direction shown in FIG. 23.

Figure 22:
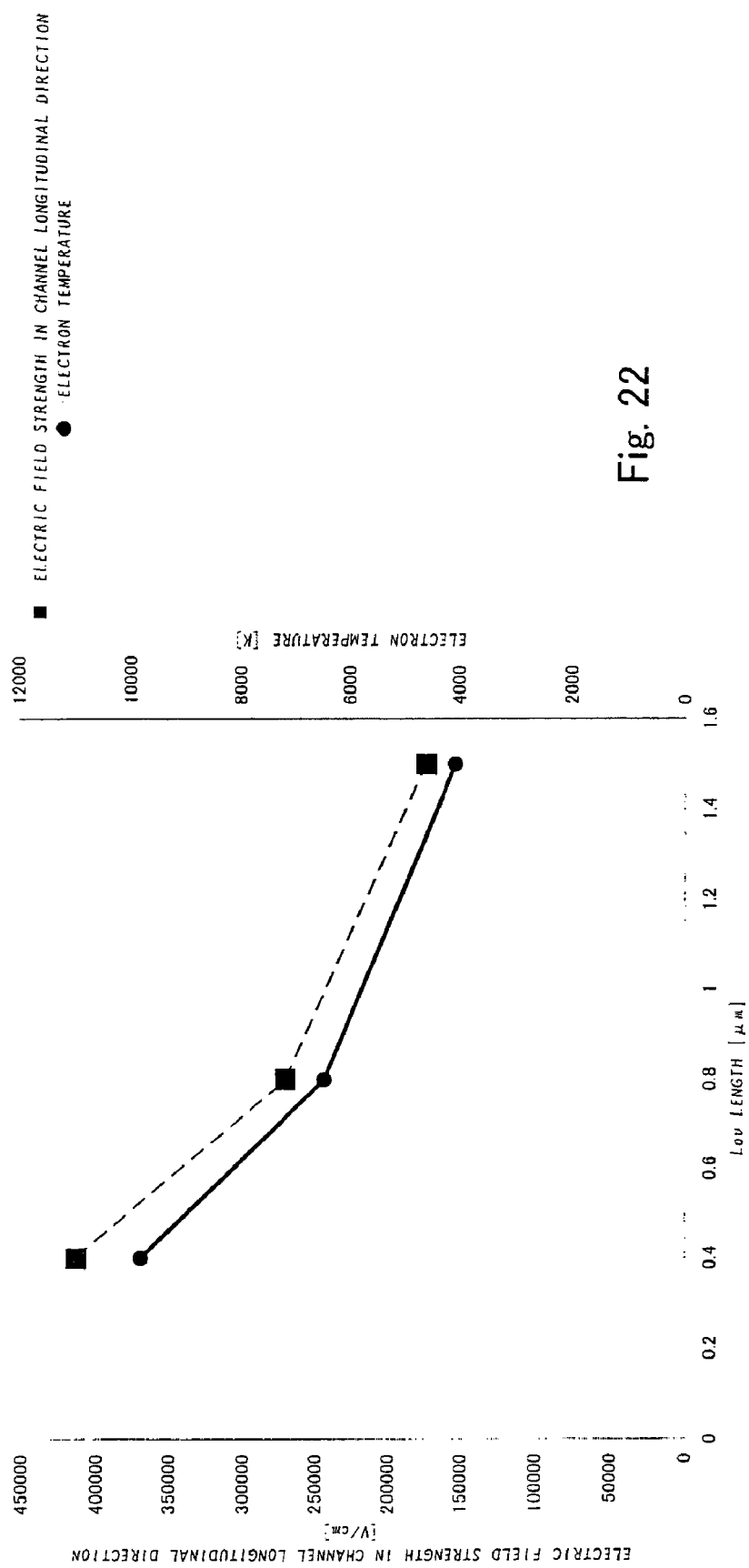
FIG. 22 is a comparison between electron temperature and horizontal directional electric field strength in the shape B.

Further, the first gate electrode 1700 shown in FIG. 19B, namely when the TaN film thickness is 30 nm, the relationship between the electric field strength in the channel longitudinal direction and the length of Lov, and the relationship between the Lov length and the electron temperature are shown in FIG. 22. The tendencies shown in FIG. 22 of the electric field strength and the electron temperature are approximately the same. It can be said, therefore, that this shows that the lower the electron temperature, the less the tendency for the TFT to degrade.

When comparing FIG. 21 and FIG. 22, the shape of FIG. 19B shown in FIG. 21 shows a lower electron temperature. In other words, seen from the viewpoint of TFT degradation, using the shape of FIG. 19B is preferable because the electron temperature can be lowered.

Further, when the Lov length is 1.5 μm, the electron temperature is low, and therefore it can be inferred that a long Lov length is preferable.

It is possible to freely combine Embodiment 11 with any of Embodiments 1 to 10.

Embodiment 12

A liquid crystal display device of the present invention can be used as a display medium in a variety of electronic equipment.

The following can be given as such electronic equipment: a video camera; a digital camera; a projector (rear type or front type); a head mounted display (goggle type display); a game apparatus; a car navigation system; a personal computer; a portable information terminal (such as a mobile computer, a portable telephone, or an electronic book); and the like. Specific examples of the electronic equipment are shown in FIGS. 17A to 17F.

Figure 17A:
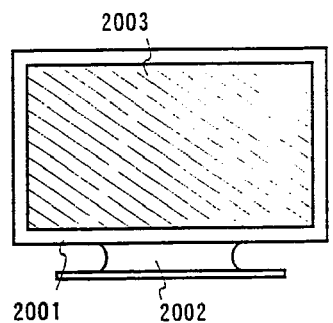
FIGS. 17A to 17F are electronic equipment using a liquid crystal display device of the present invention.

FIG. 17A shows an image display device, which contains a casing 2001, a support stand 2002, a display portion 2003 and the like. The present invention can be applied to the display portion 2003.

Figure 17B:
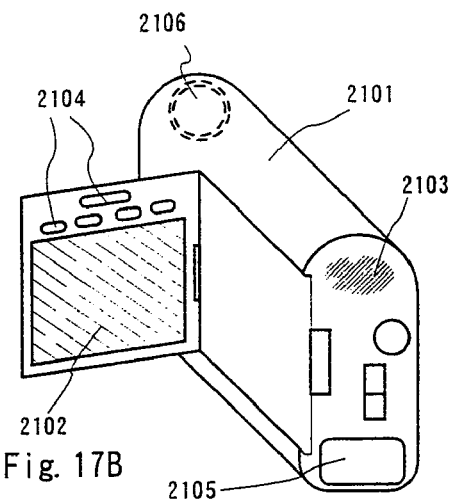

FIG. 17B shows a video camera, which contains a main body 2101, a display portion 2102, a sound input portion 2103, operation switches 2104, a battery 2105, and an image receiving portion 2106. The present invention can be applied to the display portion 2102.

Figure 17C:
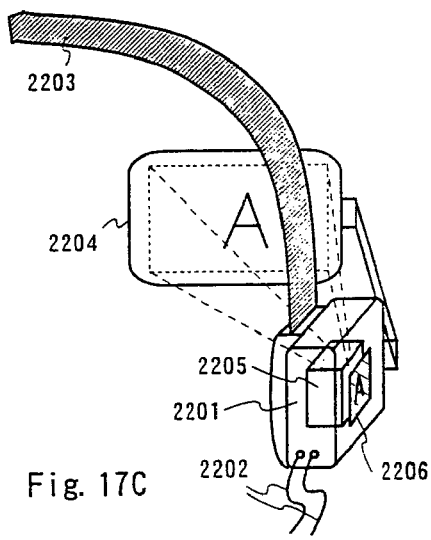

FIG. 17C shows a portion (right side) of a head mounted display, which contains a main body 2201, a signal cable 2202, a head fixing band 2203, a screen portion 2204, an optical system 2205, a display portion 2206 and the like. The present invention can be applied to the display portion 2206.

Figure 17D:
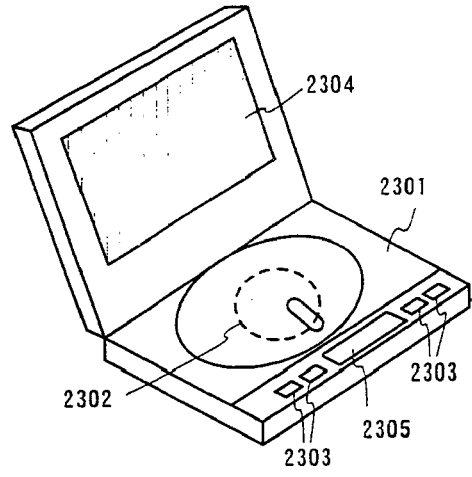

FIG. 17D shows an image playback device equipped with a recording medium (specifically, a DVD playback device), which contains a main body 2301, a recording medium (such as a DVD) 2302, operation switches 2303, a display portion (a) 2304, a display portion (b) 2305 and the like. The display portion (a) 2304 is mainly used for displaying image information. The display portion (b) 2305 is mainly used for displaying character information. The present invention can be applied to the display portion (a) 2304 and the display portion (b) 2305. Note that the image playback device equipped with the recording medium includes devices such as household game machines.

Figure 17E:
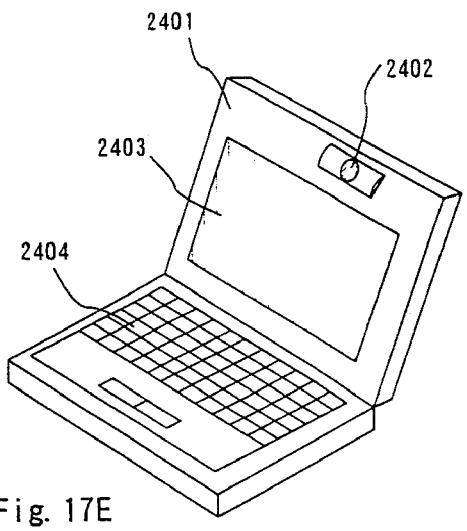

FIG. 17E shows a personal computer, which contains a main body 2401, an image input portion 2402, a display, portion 2403, and a keyboard 2404. The present invention can be applied to the display portion 2403.

Figure 17F:
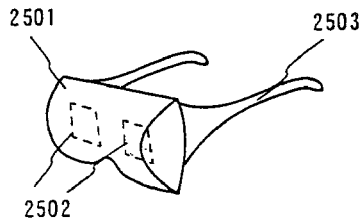

FIG. 17F shows a goggle type display, which is composed of a main body 2501, display portions 2502, and arm portions 2503. The present invention can be applied to the display portion 2502.

The applicable range of the present invention is extremely wide, as shown above, and it is possible to apply the present invention to electronic equipment in all fields. Further, the electronic equipment of Embodiment 12 can be realized using a constitution in which Embodiments 1 to 11 are freely combined.

The lengths of the first and second gate electrodes in the channel longitudinal direction (direction in which a carrier moves) (hereafter referred to simply as gate electrode width) differ as stated above with the present invention. It is therefore possible to make the ion concentration within the semiconductor layers arranged under the second gate electrode less than the ion concentration within the semiconductor layers located under the first gate electrode, and not located under the second gate electrode, by utilizing the difference in ion penetration depth, due to the differing gate electrode thicknesses, when performing ion injection using the first and second gate electrodes as masks. In addition, it is possible to make the ion concentration within the semiconductor layers located under the first gate electrode, but not under the second gate electrode, lower than the ion concentration within the semiconductor layers which are not located under the first gate electrode.

Further, in order to form the Loff region using a mask, only the width of the first gate electrode and the width of the second gate electrode must be controlled by etching. Control of the position of the Loff region and the Lov region therefore becomes easy compared to the conventional examples. Precise positional alignment of the Lov region and the Loff region therefore becomes easy, and it also becomes easy to manufacture TFTs having desired characteristics.

Further, an intermediate wiring is formed between the second interlayer insulating film and the third interlayer insulating film. The intermediate wiring can therefore be formed overlapping with the gate signal line or the source signal line, and consequently the aperture ratio can be increased.

What is claimed is:

1. A liquid crystal display device comprising:
    a semiconductor layer formed on an insulating surface, said semiconductor layer having a channel forming region, an LDD region contacting said channel forming region, and a source region and a drain region;
    a gate insulating film formed over said semiconductor layer;
    a first gate electrode comprising a first conductive film over said gate insulating film;
    a first wiring formed over said gate insulating film;
    a second gate electrode comprising a second conductive film over said first gate electrode;
    a second wiring formed over said first wiring;
    a first interlayer insulating film formed over said first gate electrode, said first wiring, said second gate electrode and said second wiring;
    a second interlayer insulating film formed over said first interlayer insulating film;
    a third wiring formed over said second interlayer insulating film and in contact with said first interlayer insulating film through a contact hole formed in said second interlayer insulating film;
    wherein a width of said first conductive film in a longitudinal direction of said channel forming region is larger than that of said second conductive film;
    wherein said channel forming region overlaps said second conductive film with said gate insulating film interposed therebetween;
    wherein said LDD region overlaps said first conductive film with said gate insulating film interposed therebetween, and
    wherein said third wiring overlaps said second wiring with said first interlayer insulating film interposed therebetween in said contact hole.

2. The liquid crystal display device according to claim 1 wherein said liquid crystal display device is selected from the group consisting of a video camera, a digital camera, a projector, a head mounted display, a game apparatus, a car navigation system, a personal computer and a portable information terminal.

3. The liquid crystal display device according to claim 1, wherein said third wiring is electrically connected to said source region or said drain region.

4. The liquid crystal display device according to claim 1, further comprising a shielding film formed over said second interlayer insulating film, said shielding film overlapping the channel forming region.

5. The liquid crystal display device according to claim 1, further comprising a shielding film formed over said second interlayer insulating film, said shielding film overlapping the channel forming region,
    wherein said third wiring is electrically connected to said source region or said drain region.

6. The liquid crystal display device according to claim 1, further comprising a shielding film formed over a substrate,
    wherein said semiconductor layer is formed over said shielding film, and
    wherein said shielding film overlaps said channel forming region.

7. A liquid crystal display device comprising:
    a semiconductor layer formed on an insulating surface, said semiconductor layer having a channel forming region, an LDD region contacting said channel forming region, and a source region and a drain region;
    a gate insulating film formed over said semiconductor layer;
    a first gate electrode comprising a first conductive film over said gate insulating film;
    a first wiring formed over said gate insulating film;
    a second gate electrode comprising a second conductive film over said first gate electrode;
    a second wiring formed over said first wiring;
    a first interlayer insulating film formed over said first gate electrode, said first wiring, said second gate electrode and said second wiring;
    a second interlayer insulating film formed over said first interlayer insulating film;
    an intermediate wiring formed over said second interlayer insulating film and in contact with said first interlayer insulating film through a first contact hole formed in said second interlayer insulating film;

wherein said channel forming region overlaps with said second conductive film with said gate insulating film interposed therebetween;

wherein said LDD region overlaps with said first conductive film with said gate insulating film interposed therebetween;

wherein said intermediate wiring overlaps with said second wiring with said first interlayer insulating film interposed therebetween in said first contact hole, and wherein said intermediate wiring is connected to said source region or said drain region through a second contact hole formed in said gate insulating film, said first interlayer insulating film and said second interlayer insulating film.

8. The liquid crystal display device according to claim 7 wherein said liquid crystal display device is selected from the group consisting of a video camera, a digital camera, a projector, a head mounted display, a game apparatus, a car navigation system, a personal computer and a portable information terminal.

9. A liquid crystal display device comprising:
a semiconductor layer formed on an insulating surface, said semiconductor layer having a channel forming region, an LDD region contacting said channel forming region, and a source region and a drain region;
a gate insulating film formed over said semiconductor layer;
a first gate electrode comprising a first conductive film over said gate insulating film;
a first wiring formed over said gate insulating film;
a second gate electrode comprising a second conductive film over said first gate electrode;
a second wiring formed over said first wiring;
a first interlayer insulating film formed over said first gate electrode, said first wiring, said second gate electrode and said second wiring;
a second interlayer insulating film formed over said first interlayer insulating film;
an intermediate wiring formed over said second interlayer insulating film and in contact with said first interlayer insulating film through a contact hole formed in said second interlayer insulating film;
a shielding film formed over said second interlayer insulating film, said shielding film made from the same material as said intermediate wiring;
wherein said channel forming region overlaps with said second conductive film with said gate insulating film interposed therebetween;
wherein said LDD region overlaps with said first conductive film with said gate insulating film interposed therebetween;
wherein said intermediate wiring overlaps with said second wiring with said first interlayer insulating film interposed therebetween in said contact hole, and
wherein said shielding film overlaps with the channel forming region.

10. The liquid crystal display device according to claim 9 wherein said liquid crystal display device is selected from the group consisting of a video camera, a digital camera, a projector, a head mounted display, a game apparatus, a car navigation system, a personal computer and a portable information terminal.

11. A liquid crystal display device comprising:
a semiconductor layer formed on an insulating surface, said semiconductor layer having a channel forming region, an LDD region contacting said channel forming region, and a source region and a drain region;
a gate insulating film formed over said semiconductor layer;
a first gate electrode comprising a first conductive film over said gate insulating film;
a first wiring formed over said gate insulating film;
a second gate electrode comprising a second conductive film over said first gate electrode;
a second wiring formed over said first wiring;
a first interlayer insulating film formed over said first gate electrode, said first wiring, said second gate electrode and said second wiring;
a second interlayer insulating film formed over said first interlayer insulating film;
an intermediate wiring formed over said second interlayer insulating film and in contact with said first interlayer insulating film through a first contact hole formed in said second interlayer insulating film;
a shielding film formed over said second interlayer insulating film, said shielding film made from the same material as said intermediate wiring;
wherein said channel forming region overlaps with said second conductive film with said gate insulating film interposed therebetween;
wherein said LDD region overlaps with said first conductive film with said gate insulating film interposed therebetween;
wherein said intermediate wiring overlaps with said second wiring with said first interlayer insulating film interposed therebetween in said first contact hole;
wherein said shielding film overlaps with the channel forming region, and
wherein said intermediate wiring is connected to said source region or said drain region through a second contact hole formed in said gate insulating film, said first interlayer insulating film and said second interlayer insulating film.

12. The liquid crystal display device according to claim 11 wherein said liquid crystal display device is selected from the group consisting of a video camera, a digital camera, a projector, a head mounted display, a game apparatus, a car navigation system, a personal computer and a portable information terminal.

* * * * *